US008766335B2

(12) United States Patent
Moriyama

(10) Patent No.: US 8,766,335 B2
(45) Date of Patent: Jul. 1, 2014

(54) SEMICONDUCTOR DEVICE

(71) Applicant: Panasonic Corporation, Osaka (JP)

(72) Inventor: Yoshiya Moriyama, Toyama (JP)

(73) Assignee: Panasonic Corporation, Osaka (JP)

(*) Notice: Subject to any disclaimer, the term of this patent is extended or adjusted under 35 U.S.C. 154(b) by 19 days.

(21) Appl. No.: 13/665,401

(22) Filed: Oct. 31, 2012

(65) Prior Publication Data

US 2013/0056804 A1 Mar. 7, 2013

Related U.S. Application Data

(63) Continuation of application No. PCT/JP2010/007057, filed on Dec. 3, 2010.

(30) Foreign Application Priority Data

Aug. 4, 2010 (JP) .................................. 2010-175247

(51) Int. Cl.
    H01L 29/86 (2006.01)
    H01L 21/02 (2006.01)
(52) U.S. Cl.
    USPC .................. 257/288; 257/529; 257/E21.004; 257/E29.325; 438/382
(58) Field of Classification Search
    None
    See application file for complete search history.

(56) References Cited

U.S. PATENT DOCUMENTS

| 2003/0218223 | A1 | 11/2003 | Nishiyama et al. |
| 2005/0179091 | A1* | 8/2005 | Nishiyama et al. ........... 257/368 |
| 2007/0196970 | A1 | 8/2007 | Niimi et al. |
| 2007/0278613 | A1 | 12/2007 | Imade |
| 2009/0212371 | A1 | 8/2009 | Kobayashi |
| 2012/0028431 | A1* | 2/2012 | Niimi et al. ................... 438/303 |

FOREIGN PATENT DOCUMENTS

| JP | 05-259450 A | 10/1993 |
| JP | 05-259450 A | 10/1993 |
| JP | 11-163163 A | 6/1999 |
| JP | 11-163163 A | 6/1999 |
| JP | 2001-085680 A | 3/2001 |
| JP | 2001-085680 A | 3/2001 |
| JP | 2006-303004 A | 11/2006 |
| JP | 2006-303004 A | 11/2006 |
| JP | 2007-251194 A | 9/2007 |
| JP | 2007-251194 A | 9/2007 |
| JP | 2008-010830 A | 1/2008 |
| JP | 2009-194532 A | 8/2009 |

OTHER PUBLICATIONS

International Search Report mailed Mar. 8, 2011 issued in corresponding International Application No. PCT/JP2010/007057.

* cited by examiner

Primary Examiner — Fernando L Toledo
Assistant Examiner — Lawrence-Linh T Nguyen
(74) Attorney, Agent, or Firm — McDermott Will & Emery LLP

(57) ABSTRACT

A semiconductor device includes a MIS transistor. The MIS transistor includes an active region surrounded by an isolation region in a semiconductor substrate, a gate insulating film formed on the active region and the isolation region, and having a high dielectric constant film, and a gate electrode formed on the gate insulating film. A nitrided region is formed in at least part of a portion of the gate insulating film that is located on the isolation region. A concentration of nitrogen contained in the nitrided region is nx, and a concentration of nitrogen contained in a portion of the gate insulating film that is located on the active region is n, wherein a relationship of nx>n is satisfied.

11 Claims, 11 Drawing Sheets

SEMICONDUCTOR DEVICE

CROSS-REFERENCE TO RELATED APPLICATION

This is a continuation of PCT International Application PCT/JP2010/007057 filed on Dec. 3, 2010 which claims priority to Japanese Patent Application No. 2010-175247 filed on Aug. 4, 2010. The disclosures of these applications including the specifications, the drawings, and the claims are hereby incorporated by reference in their entirety.

BACKGROUND

The present disclosure relates to semiconductor devices and methods for fabricating the semiconductor devices, and specifically relates to semiconductor devices which include a metal-insulator-semiconductor field-effect transistor (MISFET) including a gate insulating film having a high dielectric constant film (a high-k film) containing a metal for adjustment, and methods for fabricating the semiconductor devices.

In recent years, for the purpose of lower power consumption and higher speed of a semiconductor integrated circuit device, a semiconductor device has been proposed which includes a MISFET (hereinafter referred to as a "MIS transistor") including a high-k film (e.g., a hafnium (Hf)-based film etc.) as the gate insulating film, and a metal film, or a metal film and a silicon film, as the gate electrode.

An n-type MIS transistor has been proposed which includes a Hf-based film containing, for example, lanthanum (La) as the gate insulating film to reduce a threshold voltage (see, for example, Japanese Patent Publication No. 2009-194352).

The reason why the threshold voltage of the n-type MIS transistor can be reduced by employing the Hf-based film containing La as the gate insulating film is as follows. That is, if the Hf-based film contains La, dipoles are generated in the Hf-based film. As a result, a flat-band voltage is shifted toward a negative region, so that the effective work function of the n-type MIS transistor is shifted toward the band edge, and therefore, the threshold voltage of the n-type MIS transistor can be reduced.

A configuration of a conventional semiconductor device will be described below with reference to FIG. 14 and FIGS. 15A-15B. The conventional semiconductor device is a semiconductor device including an n-type MIS transistor which includes a gate insulating film including a high-k film containing La. FIG. 14 is a plan view showing a configuration of the conventional semiconductor device. FIG. 15A is a cross-sectional view showing the configuration of the conventional semiconductor device taken along the gate length direction. FIG. 15B is a cross-sectional view showing the configuration of the conventional semiconductor device taken along the gate width direction. Specifically, FIG. 15A and FIG. 15B are the cross-sectional views taken along the line XVa-XVa and the line XVb-XVb in FIG. 14, respectively.

As shown in FIG. 14 and FIGS. 15A-15B, the conventional semiconductor device includes an n-type MIS transistor nTr. A p-type well region 102 is formed in a semiconductor substrate 100.

As shown in FIGS. 15A-15B, the n-type MIS transistor nTr includes a gate insulating film 103A formed on an active region 100a surrounded by an isolation region 101, a gate electrode 105A formed on the gate insulating film 103A, n-type extension regions 106 formed in the active region 100a laterally outside the gate electrode 105A (see, in particular, FIG. 15A), a sidewall 108A formed on a side surface of the gate electrode 105A, and n-type source/drain regions 109 formed in the active region 100a laterally outside the sidewall 108A (see, in particular, FIG. 15A).

As shown in FIG. 14, the gate electrode 105A is formed on the active region 100a surrounded by the isolation region 101, with the gate insulating film (see 103A in FIGS. 15A and 15B) interposed between the gate electrode 105A and the active region 100a. The sidewall 108A is formed on the side surface of the gate electrode 105A.

The gate insulating film 103A includes a high-k film 103 containing La. The gate electrode 105A includes a metal film 104 and a silicon film 105. The sidewall 108A includes an inner sidewall 107 and an outer sidewall 108.

SUMMARY

The present inventor has intensively studied the n-type MIS transistor which includes a gate insulating film including a high-k film containing a metal (e.g., La, etc.) for adjusting a threshold voltage to find the following novel problem.

The gate width needs to be reduced for further miniaturization of a semiconductor device. However, in an n-type MIS transistor which includes a gate insulating film including a high-k film containing a metal for adjustment, a problem arises in which the threshold voltage increases with a decrease in the gate width.

This problem will be described with reference to FIG. 16. FIG. 16 is a graph showing a relationship between the gate width and the threshold voltage.

The threshold voltage was measured with various gate widths (see the reference character W in FIG. 15B), while maintaining a constant protrusion amount (see the reference character D in FIG. 15B) from one end of the active region in the gate width direction to one end of the gate insulating film in the gate width direction. The result is shown in FIG. 16.

As indicated by solid line in FIG. 16, a threshold voltage value Vthh where the gate width is Wh is greater than a threshold voltage Vthl where the gate width is W1 (W1>Wh) (Vthh>Vthl).

As indicated by dashed line in FIG. 16, it is ideal that the threshold voltage value where the gate width is Wh is equal to the threshold voltage value where the gate width is W1. In other words, it is ideal if the threshold voltage does not increase with a decrease in the gate width. However, as indicated by solid line in FIG. 16, the threshold voltage increases with a decrease in the gate width.

In view of this, it is an objective of the present disclosure to provide a semiconductor device which includes a MIS transistor including a gate insulating film including a high-k film containing a metal for adjustment, in which an increase in a threshold voltage of the MIS transistor is prevented.

To achieve the above objective, a semiconductor device according to the present disclosure includes a MIS transistor, wherein the MIS transistor includes an active region surrounded by an isolation region in a semiconductor substrate, a gate insulating film formed on the active region and the isolation region, and having a high dielectric constant film, and a gate electrode formed on the gate insulating film, a nitrided region is formed in at least part of a portion of the gate insulating film that is located on the isolation region, a concentration of nitrogen contained in the nitrided region is nix, and a concentration of nitrogen contained in a portion of the gate insulating film that is located on the active region is n, wherein a relationship of nx>n is satisfied.

In the semiconductor device of the present disclosure, a nitrided region is formed in at least part of a portion of the gate insulating film that is located on the isolation region, and a nitrogen concentration nx of the nitrided region is higher than a nitrogen concentration n of a portion of the gate insulating film that is located on the active region. That is, a relationship of nx>n is satisfied. As a result, it is possible to prevent the oxygen (O) contained in the isolation region from being diffused into the nitrided region during a thermal treatment. Thus, it is possible to prevent the oxygen contained in the isolation region from being diffused in the high dielectric constant film (in particular, into a portion of the high dielectric constant film that is located on the active region) through the nitrided region. Accordingly, it is possible to prevent reaction between a metal for adjustment (e.g., La) contained in the high dielectric constant film and the oxygen contained in the isolation region, and prevent generation of neutralized dipoles. Thus, even if the gate width is reduced with miniaturization of the semiconductor device, an increase in the threshold voltage of the MIS transistor can be prevented.

According to the semiconductor device of the present disclosure, it is preferable that the nitrided region includes a first nitrided region formed at one end of the gate insulating film in a gate width direction, and a second nitrided region formed at the other end of the gate insulating film in the gate width direction, a width of the first nitrided region in the gate width direction is w1, a width of the second nitrided region in the gate width direction is w2, a protrusion amount from one end of the active region in the gate width direction to one end of the gate insulating film in the gate width direction is d1, and a protrusion amount from the other end of the active region in the gate width direction to the other end of the gate insulating film in the gate width direction is d2, wherein a relationship of w1≤d1 and w2≤d2 is satisfied.

In this configuration, the first and second nitrided regions are not formed on the active region, and is formed only on the isolation region. Accordingly, the nitrogen concentration n of a portion of the gate insulating film that is located on the active region can be constant. Thus, the effective work function of the MIS transistor can be constant, which leads to stable transistor characteristics of the MIS transistor.

According to the semiconductor device of the present disclosure, it is preferable that the nitrided region is not formed in the portion of the gate insulating film that is located on the active region.

According to the semiconductor device of the present disclosure, it is preferable that nitrogen concentrations of portions of the isolation region that are located laterally outside the gate electrode in the gate width direction are higher than a nitrogen concentration of a portion of the isolation region that is located below the gate electrode.

According to the semiconductor device of the present disclosure, it is preferable that nitrogen concentrations of portions of the isolation region that are located laterally outside the gate electrode in the gate width direction are higher than nitrogen concentrations of portions of the isolation region that are located laterally outside the active region in a gate length direction.

According to the semiconductor device of the present disclosure, it is preferable that the nitrogen concentration nx is $2 \times 10^{22}$ atoms/cm$^3$ or higher.

According to the semiconductor device of the present disclosure, it is preferable that the nitrogen concentration n is $1 \times 10^{22}$ atoms/cm$^3$ or lower.

According to the semiconductor device of the present disclosure, it is preferable that the MIS transistor is an n-type MIS transistor.

According to the semiconductor device of the present disclosure, it is preferable that the gate insulating film contains a metal for adjustment.

According to the semiconductor device of the present disclosure, it is preferable that the metal for adjustment is lanthanum.

According to the semiconductor device of the present disclosure, it is preferable that the gate electrode includes a metal film formed on the gate insulating film, and a silicon film formed on the metal film.

According to the semiconductor device of the present disclosure, it is preferable that a nitrogen concentration of a portion of the metal film that is located above the isolation region is higher than a nitrogen concentration of a portion of the metal film that is located above the active region.

To achieve the above objective, a method for fabricating a semiconductor device according to the present disclosure is a method for fabricating a semiconductor device which includes a MIS transistor including a gate insulating film formed on an active region in a semiconductor substrate and a gate electrode, wherein the method includes the steps of (a) forming an isolation region which surrounds the active region in the semiconductor substrate, (b) forming, on the active region and the isolation region, a gate insulating film formation film including a high dielectric constant film, (c) forming a gate electrode formation film on the gate insulating film formation film, (d) patterning the gate electrode formation film and the gate insulating film formation film, thereby exposing both ends of each of the gate insulating film formation film and the gate electrode formation film on the isolation region, (e) nitriding, after (d), both end portions of the gate insulating film formation film in a gate width direction, thereby forming a nitrided region on the isolation region, (f) patterning, after (e), the gate electrode formation film and the gate insulating film formation film, thereby forming the gate insulating film and the gate electrode, wherein in (d), both ends of each of the gate insulating film and the gate electrode in the gate width direction are defined, and in (f), both ends of each of the gate insulating film and the gate electrode in a gate length direction are defined.

In the method for fabricating a semiconductor device according to the present disclosure, both end portions of the gate insulating film formation film in the gate width direction are nitrided to form nitrided regions located on the isolation region. Thus, it is possible to form nitrided regions at the both end portions of the gate insulating film in the gate width direction, which are located on the isolation region, and therefore possible to make the nitrogen concentrations of the nitrided regions higher than the nitrogen concentration of a portion of the gate insulating film that is located on the active region. As a result, it is possible to prevent the oxygen contained in the isolation region from being diffused into the nitrided regions during a thermal treatment, and therefore, it is possible to prevent the oxygen contained in the isolation region from being diffused in the high dielectric constant film (in particular, a portion of the high dielectric constant film that is located on the active region) through the nitrided regions. Accordingly, it is possible to prevent reaction between a metal for adjustment (e.g., La) contained in the high dielectric constant film and the oxygen contained in the isolation region, and prevent generation of neutralized dipoles. Thus, even if the gate width is reduced with miniaturization of the semiconductor device, an increase in the threshold voltage of the MIS transistor can be prevented.

According to the method for fabricating a semiconductor device according to the present disclosure, it is preferable that in (e), a concentration of nitrogen contained in the nitrided region is NX, and a concentration of nitrogen contained in a portion of the gate insulating film formation film that is located on the active region is N, wherein a relationship of NX>N is satisfied.

According to the method for fabricating a semiconductor device according to the present disclosure, it is preferable that in (d), one end of the gate insulating film formation film in the gate width direction protrudes from one end of the active region in the gate width direction by a protrusion amount D1 to be located on the isolation region, whereas the other end of the gate insulating film formation film in the gate width direction protrudes from the other end of the active region in the gate width direction by a protrusion amount D2 to be located on the isolation region; in (e), the nitrided region includes a first nitrided region formed by nitriding one end portion of the gate insulating film formation film in the gate width direction, and a second nitrided region formed by nitriding the other end portion of the gate insulating film formation film in the gate width direction; a width of the first nitrided region in the gate width direction is W1, and a width of the second nitrided region in the gate width direction is W2, wherein a relationship of W1≤D1 and W2≤D2 is satisfied.

In this configuration, the first and second nitrided regions are not formed on the active region, and is formed only on the isolation region. Accordingly, the nitrogen concentration of a portion of the gate insulating film formation film that is located on the active region can be constant. Thus, the effective work function of the MIS transistor which includes the gate insulating film obtained by patterning the gate insulating film formation film can be constant, which leads to stable transistor characteristics of the MIS transistor.

As described above, according to the semiconductor device of the present disclosure and the method for fabricating the semiconductor device, it is possible to prevent an increase in the threshold voltage of the MIS transistor even if the gate width is reduced with miniaturization of the semiconductor device.

BRIEF DESCRIPTION OF THE DRAWINGS

FIG. 6A is a cross-sectional view in the gate length direction, taken along the line VIa-VIa in FIG. 5. FIG. 6B is a cross-sectional view in the gate width direction, taken along the line VIb-VIb in FIG. 5.

FIG. 7A is a cross-sectional view taken along the gate length direction. FIG. 7B is a cross-sectional view taken along the gate width direction.

FIG. 8A is a cross-sectional view taken along the gate length direction. FIG. 8B is a cross-sectional view taken along the gate width direction.

FIG. 9A is a cross-sectional view taken along the gate length direction. FIG. 9B is a cross-sectional view taken along the gate width direction.

FIG. 10A is a cross-sectional view taken along the gate length direction. FIG. 10B is a cross-sectional view taken along the gate width direction.

FIG. 11A is a cross-sectional view taken along the gate length direction. FIG. 11B is a cross-sectional view taken along the gate width direction.

FIG. 12A is a cross-sectional view taken along the gate length direction. FIG. 12B is a cross-sectional view taken along the gate width direction.

FIG. 13A is a cross-sectional view taken along the gate length direction. FIG. 13B is a cross-sectional view taken along the gate width direction.

FIG. 15A is a cross-sectional view in the gate length direction, taken along the line XVa-XVa in FIG. 14. FIG. 15B is a cross-sectional view in the gate width direction, taken along the line XVb-XVb in FIG. 14.

DETAILED DESCRIPTION

Figure 1A:
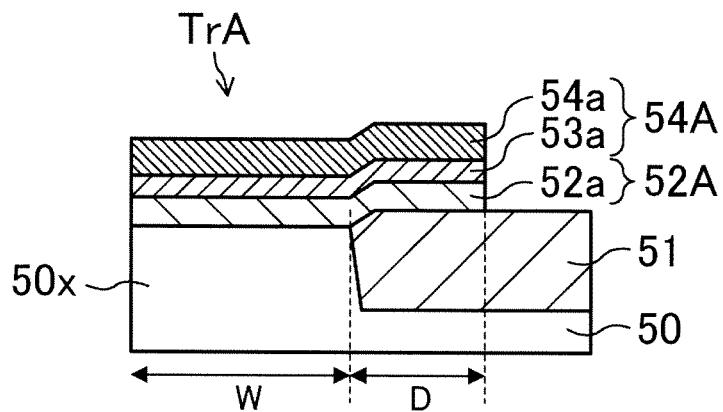
FIG. 1A is a cross-sectional view showing a configuration of a semiconductor device according to the first example, taken along the gate width direction.
Figure 1B:
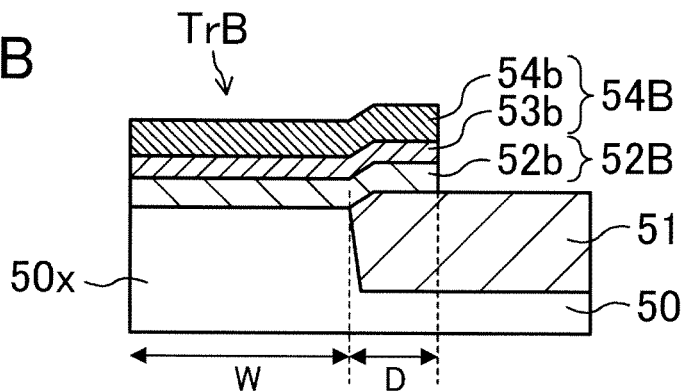
FIG. 1B is a cross-sectional view showing a configuration of a semiconductor device according to the second example, taken along the gate width direction.
Figure 2:
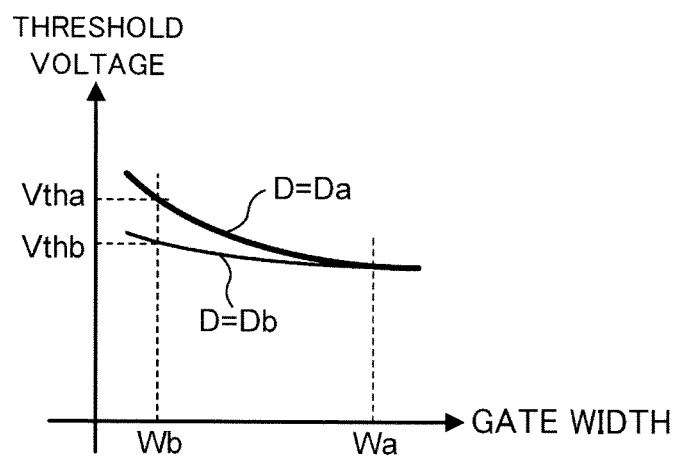
FIG. 2 is a graph showing a relationship between the gate width and a threshold voltage.

The present inventor has further intensively studied the above novel problem which was found by the inventor to find the following. The finding will be described with reference to FIGS. 1A and 1B and FIG. 2. FIG. 1A is a cross-sectional view showing a configuration of a semiconductor device according to the first example, taken along the gate width direction. FIG. 1B is a cross-sectional view showing a configuration of a semiconductor device according to the second example, taken along the gate width direction. FIG. 2 is a graph showing a relationship between the gate width and a threshold voltage.

As shown in FIG. 1A, an n-type MIS transistor TrA is formed on an active region 50x surrounded by an isolation region 51 in a semiconductor substrate 50. On the other hand, as shown in FIG. 1B, an n-type MIS transistor TrB is formed on an active region 50x surrounded by an isolation region 51 in a semiconductor substrate 50.

The n-type MIS transistor TrA, TrB includes a gate insulating film 52A, 52B formed on the active region 50x, and a gate electrode 54A, 54B formed on the gate insulating film 52A, 52B. The gate insulating film 52A, 52B includes a high-k film 52A, 52B containing La. The gate electrode 54A, 54B includes a metal film 53a, 53b and a silicon film 54a, 54b.

As shown in FIG. 1A, a protrusion amount D from one end of the active region 50x in the gate width direction to one end of the gate insulating film 52A in the gate width direction has a value Da. On the other hand, as shown in FIG. 1B, a protrusion amount D from one end of the active region 50x in the gate width direction to one end of the gate insulating film 52B in the gate width direction has a value Db (Db<Da).

The threshold voltage of the n-type MIS transistor TrA in FIG. 1A was measured with various gate widths W. In other words, the threshold voltage was measured with various gate widths W, while maintaining the protrusion amount D at Da (a constant value). The result is shown by thick line in FIG. 2.

On the other hand, the threshold voltage of the n-type MIS transistor TrB in FIG. 1B was measured with various gate widths W. In other words, the threshold voltage was measured with various gate widths W, while maintaining the protrusion amount D at Db (a constant value). The result is shown by thin line in FIG. 2.

As shown in FIG. 2, when the gate width W is Wa (in other words, in the case of having a relatively great gate width W), a threshold voltage value where the protrusion amount D is Da and a threshold voltage value where the protrusion amount D is Db are the same.

On the other hand, as shown in FIG. 2, when the gate width W is Wb (in other words, in the case of having a relatively narrow gate width W), a threshold voltage value Vtha where the protrusion amount D is Da is greater than a threshold voltage value Vthb where the protrusion amount D is Db (Vtha>Vthb).

As shown in FIG. 2, in both cases where the protrusion amount D is Da and where the protrusion amount D is Db, the threshold voltage value where the gate width W is Wb is greater than the threshold voltage value where the gate width W is Wa. That is, the threshold voltage increases with a decrease in the gate width.

As shown in FIG. 2, the degree of the increase in the threshold voltage where the protrusion amount D is Da (see the thick line) is higher than the degree of the increase in the threshold voltage where the protrusion amount D is Db (see the thin line). That is, the degree of the increase in the threshold voltage increases with an increase in the protrusion amount. This shows that the protrusion amount is deeply involved with the increase in the threshold voltage.

The reason why the threshold voltage increases with a decrease in the gate width may be as follows.

During a thermal treatment after formation of the high-k film containing La, if oxygen (O) is diffused in the high-k film (particularly, in a portion of the high-k film which contacts the active region) and the oxygen reacts with the La contained in the high-k neutralization of dipoles occurs. As a result, the flat-band voltage is shifted toward the positive region, and the effective work function of the n-type MIS transistor is shifted toward the mid-gap. Accordingly, the threshold voltage of the n-type MIS transistor increases. Here, the main diffusion source of the oxygen which reacts with the La contained in the high-k film may be the isolation region, etc. The thermal treatment may be performed, for example, to activate an n-type impurity contained in an n-type source/drain implantation region.

If the protrusion amount D is constant, the ratio of the protrusion amount D to the gate width W increases with a decrease in the gate width W. The ratio of the high-k film which contacts with the isolation region is increased with an increase in the ratio of the protrusion amount D to the gate width W. Thus, during the thermal treatment, a larger amount of oxygen (O) is diffused from the isolation region to the high-k film. Accordingly, neutralization of dipoles is more significant, and the threshold voltage of the n-type MIS transistor is significantly increased.

As can be seen from the above description, the present inventor has further intensively studied the above novel problem which was found by the inventor, to find that it is effective to reduce the protrusion amount in order to prevent an increase in the threshold voltage.

Figure 3A:
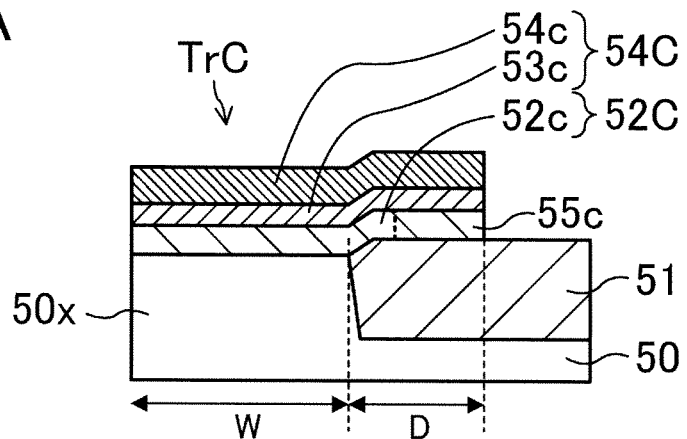
FIG. 3A is a cross-sectional view showing a configuration of a semiconductor device according to the third example, taken along the gate width direction.
Figure 3B:
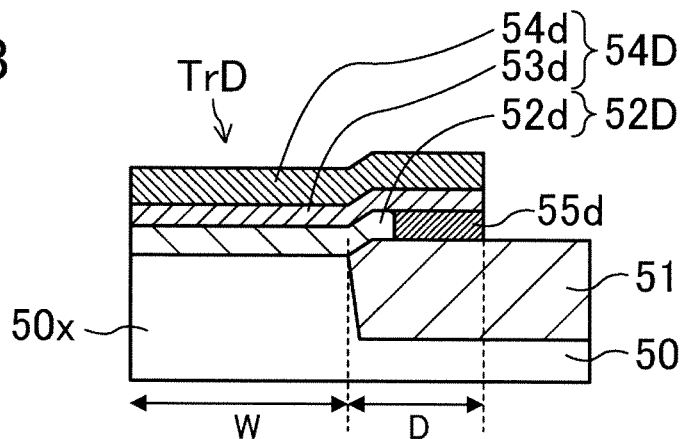
FIG. 3B is a cross-sectional view showing a configuration of a semiconductor device according to the fourth example, taken along the gate width direction.
Figure 4:
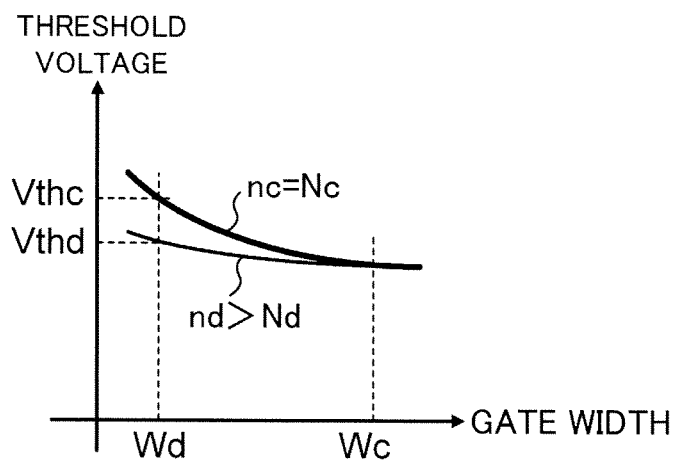
FIG. 4 is a graph showing a relationship between the gate width and a threshold voltage.

In view of the above finding, intensive studies were carried out by the present inventor to find the following. The finding will be described with reference to FIGS. 3A and 3B and FIG. 4. FIG. 3A is a cross-sectional view showing a configuration of a semiconductor device according to the third example, taken along the gate width direction. FIG. 3B is a cross-sectional view showing a configuration of a semiconductor device according to the fourth example, taken along the gate width direction. FIG. 4 is a graph showing a relationship between the gate width and a threshold voltage.

As shown in FIG. 3A, an n-type MIS transistor TrC is formed on an active region 50x surrounded by an isolation region 51 in a semiconductor substrate 50. On the other hand, as shown in FIG. 3B, an n-type MIS transistor TrD is formed on an active region 50x surrounded by an isolation region 51 in a semiconductor substrate 50.

The n-type MIS transistor TrC, TrD includes a gate insulating film 52C, 52D formed on the active region 50x, and a gate electrode 54C, 54D formed on the gate insulating film 52C, 52D. The gate insulating film 52C, 52D includes a high-k film 52c, 52d containing La. The gate electrode 54C, 54D includes a metal film 53c, 53d and a silicon film 54c, 54d.

As shown in FIG. 3B, a nitrided region 55d is formed at an end portion of the gate insulating film 52D in the gate width direction.

A protrusion amount D from one end of the active region 50x in the gate width direction to one end of the gate insulating film 52C in the gate width direction has a value Dc. On the other hand, a protrusion amount D from one end of the active region 50x in the gate width direction to one end of the gate insulating film 52D in the gate width direction has a value Dd. Here, the value Dc is equal to the value Dd.

A concentration of nitrogen contained in an end portion 55c of the gate insulating film 52C in the gate width direction is nc, and a concentration of nitrogen contained in a portion of the gate insulating film 52C that is located on the active region 50x is Nc. Here, nc is equal to Nc. The width of the end portion 55c in the gate width direction and the width of the nitrided region 55d in the gate width direction are the same.

A concentration of nitrogen contained in the nitrided region 55d is nd, and a concentration of nitrogen contained in a portion of the gate insulating film 52D that is located on the active region 50x is Nd. Here, nd is higher than Nd, and Nc is equal to Nd.

The threshold voltage of the n-type MIS transistor TrC in FIG. 3A was measured with various gate widths W. In other words, the threshold voltage was measured with various gate widths W, while making the nitrogen concentration nc equal to the nitrogen concentration Nc (nc=Nc, wherein Nc=Nd) and setting the protrusion amount D to Dc (wherein Dc=Dd). The result is shown by thick line in FIG. 4.

On the other hand, the threshold voltage of the n-type MIS transistor TrD in FIG. 3B was measured with various gate widths W. In other words, the threshold voltage was measured with various gate widths W, while making the nitrogen concentration nd higher than the nitrogen concentration Nd (nd>Nd, wherein Nd=Nc) and setting the protrusion amount D to Dd (wherein Dd=Dc). The result is shown by thin line in FIG. 4.

As shown in FIG. 4, when the gate width W is We (in other words, in the case of having a relatively great gate width W), a threshold voltage value where nc=Nc and a threshold voltage value where nd>Nd are the same.

On the other hand, as shown in FIG. 4, when the gate width W is Wd (in other words, in the case of having a relatively narrow gate width W), a threshold voltage value Vthc where nc=Nc is greater than a threshold voltage value Vthd where nd>Nd (Vthc>Vthd).

As shown in FIG. 4, in both of the cases where nc=Nc and nd>Nd, the threshold voltage value where the gate width W is Wd is greater than the threshold voltage value where the gate width W is Wc. That is, the threshold voltage increases with a decrease in the gate width.

As shown in FIG. 4, the degree of the increase in the threshold voltage where nd>Nd (see the thin line) is lower than the degree of the increase in the threshold voltage where nc=Nc (see the thick line). That is, the degree of the increase in the threshold voltage decreases with an increase in the nitrogen concentration of a portion of the gate insulating film that is located on the isolation region.

The reason why the degree of the increase in the threshold voltage can be reduced by increasing the nitrogen concentration of the portion of the gate insulating film that is located on the isolation region may be as follows.

The oxygen contained in the isolation region can be prevented from being diffused into the portion of the gate insulating film that is located on the isolation region during a thermal treatment after formation of the high-k film containing La, by increasing the nitrogen concentration of the portion of the gate insulating film that is located on the isolation region. Thus, the oxygen contained in the isolation region can be prevented from being diffused into the high-k film (in particular, into a portion of the high-k film that is located on the active region) through the portion of the gate insulating film that is located on the isolation region. Accordingly, it is possible to prevent the La contained in the high-k film (in particular, the portion of the high-k film that is located on the active region) from reacting with the oxygen contained in the isolation region, and prevent generation of neutralized dipoles. As a result, it is possible to prevent the flat-band voltage from being shifted toward the positive region, and the effective work function of the n-type MIS transistor from being shifted toward the mid-gap. Thus, an increase in the threshold voltage of the n-type MIS transistor can be prevented.

As can be seen from the above description, intensive studies were carried out by the present inventor to find that it is effective to increase the nitrogen concentration of the portion of the gate insulating film that is located on the isolation region in order to prevent an increase in the threshold voltage. The present disclosure was made based on the findings found by the present inventor.

Embodiments of the present disclosure will be described below with reference to the drawings.

(Embodiment)

Figure 5:
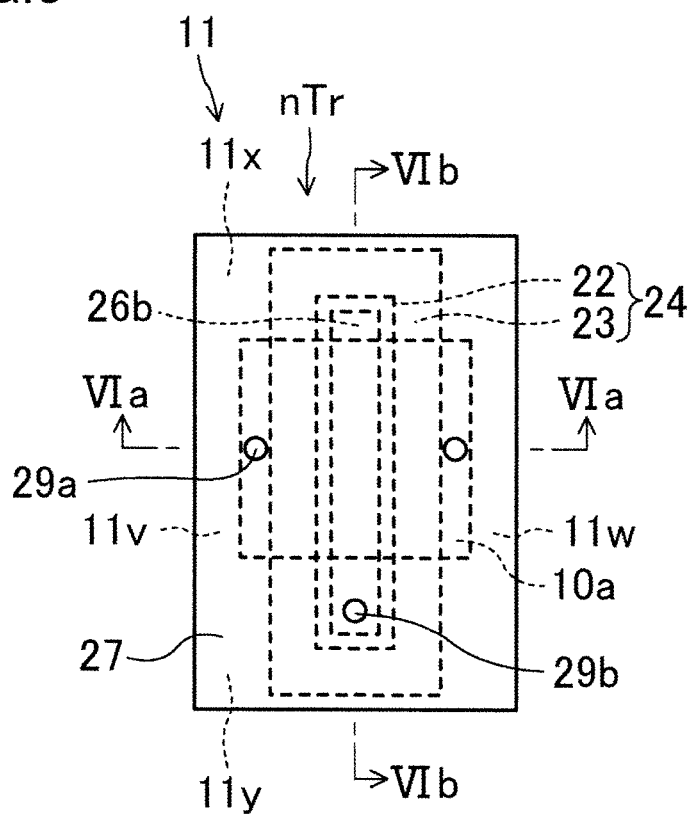
FIG. 5 is a plan view showing a configuration of a semiconductor device according to an embodiment of the present disclosure.
Figure 6A:
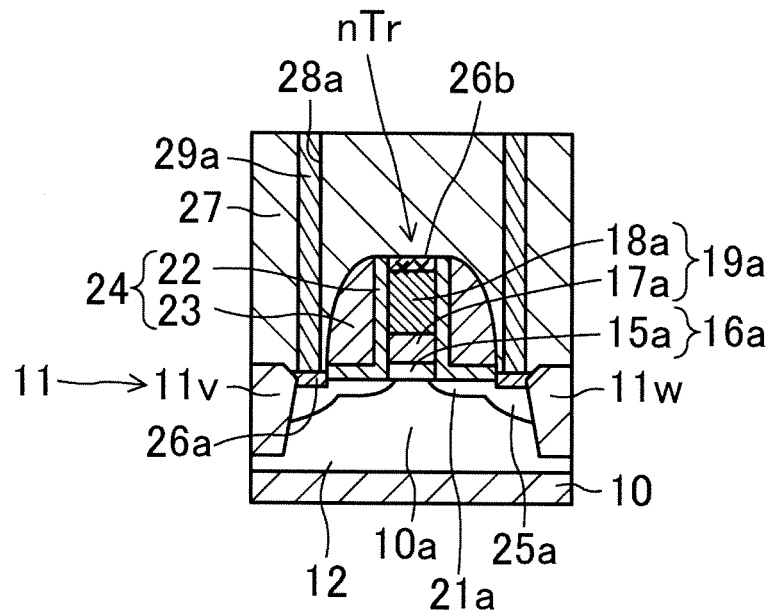
FIGS. 6A and 6B show cross-sectional views of the configuration of the semiconductor device of the embodiment of the present disclosure.
Figure 6B:
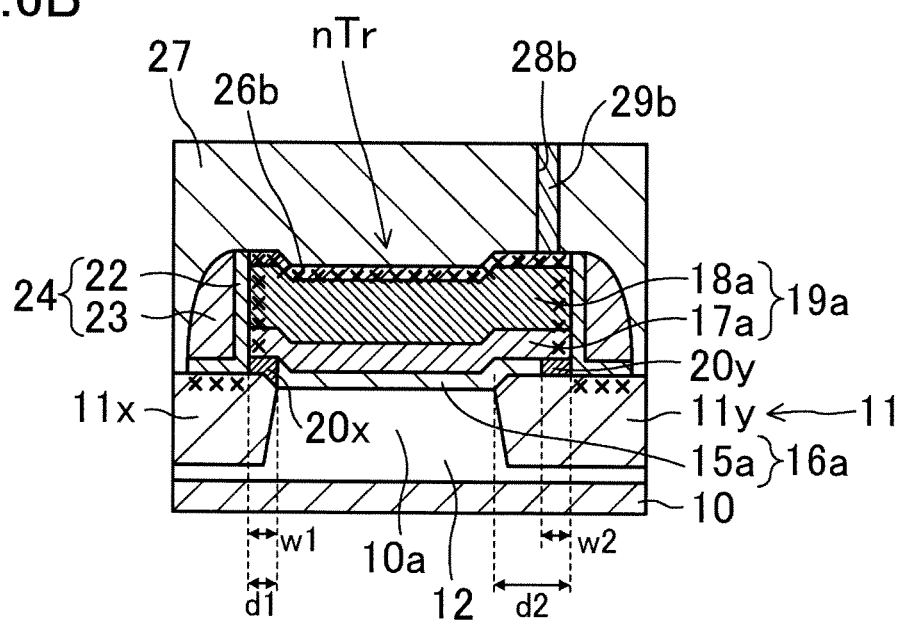

A configuration of a semiconductor device according to an embodiment of the present disclosure will be described below with reference to FIG. 5 and FIGS. 6A and 6B. FIG. 5 is a plan view showing a configuration of the semiconductor device of the embodiment of the present disclosure. FIG. 6A is a cross-sectional view showing the configuration of the semiconductor device of the embodiment of the present disclosure, taken along the gate length direction. FIG. 6B is a cross-sectional view showing the configuration of the semiconductor device of the embodiment of the present disclosure, taken along the gate width direction. Specifically, FIGS. 6A and 6B are cross-sectional views taken along the line VIa-VIa and the line VIb-VIb shown in FIG. 5, respectively.

As shown in FIG. 5 and FIGS. 6A and 6B, the semiconductor device according to the present embodiment includes an n-type MIS transistor nTr formed on an active region 10*a* surrounded by an isolation region 11 in a semiconductor substrate 10.

As shown in FIG. 5, the isolation region 11 includes first to fourth isolation portions 11*x*-11*w*.

As shown in FIG. 5, the first and second isolation portions 11*x*, 11*y* are portions of the isolation region 11 which are located on lateral sides of the active region 10*a* in the gate width direction. One of the portions is the first isolation portion 11*x*, and the other is the second isolation portion 11*y*. The first isolation portion 11*x* is in contact with one end of the active region 10*a* in the gate width direction (in FIG. 5, the upper side end of the active region 10*a*). On the other hand, the second isolation portion 11*y* is in contact with the other end of the active region 10*a* in the gate width direction (in FIG. 5, the lower side end of the active region 10*a*). The first isolation portion 11*x* and the second isolation portion 11*y* face each other in the gate width direction, with the active region 10*a* interposed therebetween.

As shown in FIG. 5, the third and fourth isolation portions 11*v*, 11*w* are portions of the isolation region 11 which are located on lateral sides of the active region 10*a* in the gate length direction. One of the portions is the third isolation portion 11*v*, and the other is the fourth isolation portion 11*w*. The third isolation portion 11*v* is in contact with one end of the active region 10*a* in the gate length direction (in FIG. 5, the left side end of the active region 10*a*). On the other hand, the fourth isolation portion 11*w* is in contact with the other end of the active region 10*a* in the gate length direction (in FIG. 5, the right side end of the active region 10*a*). The third isolation portion 11*v* and the fourth isolation portion 11*w* face each other in the gate length direction, with the active region 10*a* interposed therebetween.

As shown in FIGS. 6A and 6B, the n-type MIS transistor nTr includes: the active region 10*a* surrounded by the isolation region 11 in the semiconductor substrate 10; a gate insulating film 16*a* formed on the active region 10*a* and the isolation region 11 (on the first and second isolation portions 11*x*, 11*y*); a gate electrode 19*a* formed on the gate insulating film 16*a*; n-type extension regions 21*a* (see, in particular, FIG. 6A) formed in the active region 10*a* laterally outside the gate electrode 19*a*; a sidewall 24 formed on a side surface of the gate electrode 19*a*; n-type source/drain regions 25*a* (see, in particular, FIG. 6A) formed in the active region 10*a* laterally outside the sidewall 24; a first silicide film 26*a* (see, in particular, FIG. 6A) formed on the n-type source/drain region 25*a*; and a second silicide film 26*b* formed on the gate electrode 19*a*.

As shown in FIGS. 6A and 6B, the gate insulating film 16*a* includes a high-k film 15*a* containing a metal for adjustment (such as La). The gate electrode 19*a* includes a metal film 17*a* and a silicon film 18*a*. The sidewall 24 includes an inner sidewall 22 having an L-shaped cross section, and an outer sidewall 23.

As shown in FIG. 6B, the gate insulating film 16*a* includes first and second nitrided regions 20*x*, 20*y* at portions located on the isolation region 11. The first nitrided region 20*x* is formed at one end of the gate insulating film 16*a* in the gate width direction, and located on the first isolation portion 11x. The second nitrided region 20y is formed at the other end of the gate insulating film 16a in the gate width direction, and located on the second isolation portion 11y.

As shown in FIGS. 6A and 6B, an interlayer insulating film 27 is formed on the semiconductor substrate 10 to cover the n-type MIS transistor nTr. As shown in FIG. 6A, a first contact plug 29a is formed in a first contact hole 28a formed in the interlayer insulating film 27. The first contact plug 29a is in contact with the first silicide film 26a. As shown in FIG. 6B, a second contact plug 29b is formed in a second contact hole 28b formed in the interlayer insulating film 27. The second contact plug 29b is in contact with the second silicide film 26b.

As shown in FIG. 5, a gate electrode (see 19a in FIGS. 6A and 6B) is formed on the active region 10a surrounded by the isolation region 11, with the gate insulating film (see 16a in FIGS. 6A and 6B) interposed between the gate electrode and the active region 10a. The sidewall 24 is formed on the side surface of the gate electrode. The n-type source/drain regions (not shown, see 25a in FIG. 6A) are formed in the active region 10a laterally outside the sidewall 24. The first silicide film (not shown, see 26a in FIG. 6A) is formed on the n-type source/drain region. The second silicide film 26b is formed on the gate electrode. The interlayer insulating film 27 is formed on the semiconductor substrate 10 to cover the n-type MIS transistor nTr. The first and second contact plugs 29a, 29b are formed in the first and second contact holes formed in the interlayer insulating film 27, and are in contact with the first and second silicide films, respectively.

A concentration of nitrogen contained in the first nitrided region 20x is n1. A concentration of nitrogen contained in the second nitrided region 20y is n2. A concentration of nitrogen contained in a portion of the gate insulating film 16a that is located on the active region 10a is n. Here, a relationship of n1>n and n2>n is satisfied. For example, the nitrogen concentration n1, n2 is equal to or greater than $2\times10^{22}$ atoms/cm$^3$ (n1≥$2\times10^{22}$ atoms/cm$^3$, n2≥$2\times10^{22}$ atoms/cm$^3$). For example, the nitrogen concentration n is equal to or less than $1\times10^{22}$ atoms/cm$^3$ (n≤$1\times10^{22}$ atoms/cm$^3$).

The width of the first nitrided region 20x in the gate width direction is w1 (see FIG. 6B). The width of the second nitrided region 20y in the gate width direction is w2 (see FIG. 6B). The protrusion amount from one end of the active region 10a in the gate width direction to one end of the gate insulating film 16a in the gate width direction is d1. The protrusion amount from the other end of the active region 10a in the gate width direction to the other end of the gate insulating film 16a in the gate width direction is d2. Here, a relationship of w1≤d1 and w2≤d2 is satisfied. In the present embodiment, w1=d1 and w2<d2, for example.

The one end of the active region 10a in the gate width direction is the end of the surface of the active region 10a which contacts the first isolation portion 11x, as shown in FIG. 6B. The other end of the active region 10a in the gate width direction is the end of the surface of the active region 10a which contacts the second isolation portion 11y.

The one end of the gate insulating film 16a in the gate width direction is the end located on the first isolation portion 11x, as shown in FIG. 6B. The other end of the gate insulating film 16a in the gate width direction is the end located on the second isolation portion 11y.

Portions of the isolation region 11 which are located laterally outside the gate electrode 19a in the gate width direction contain nitrogen (see the cross marks in FIG. 6B). This nitrogen is derived from the nitrogen used to form the first and second nitrided regions 20x, 20y (e.g., nitrogen contained in plasma) as described later.

The nitrogen concentrations of the portions of the isolation region 11 located laterally outside the gate electrode 19a in the gate width direction are higher than the nitrogen concentration of a portion of the isolation region 11 located below the gate electrode 19a. The nitrogen concentrations of the portions of the isolation region 11 located laterally outside the gate electrode 19a in the gate width direction are higher than the nitrogen concentrations of portions of the isolation region 11 located laterally outside the active region 10a in the gate length direction (i.e., the third and fourth isolation portions 11v, 11w).

The both end portions of the gate electrode 19a in the gate width direction and the upper surface portion of the gate electrode 19a contain nitrogen (see the cross marks in FIG. 6B). The nitrogen is derived from the nitrogen used to form the first and second nitrided regions 20x, 20y (e.g., nitrogen contained in plasma) as described later.

The nitrogen concentration of a portion of the metal film 17a that is located above the isolation region 11 (i.e., the first and second isolation portions 11x, 11y) is higher than the nitrogen concentration of a portion of the metal film 17a that is located above the active region 10a.

The nitrogen concentration of a portion of the silicon film 18a that is located above the active region 10a is higher in an upper portion thereof than in a lower portion thereof. The nitrogen concentration of a portion of the silicon film 18a that is located above the isolation region 11 (i.e., the first and second isolation portions 11x, 11y) is higher than the nitrogen concentration of the lower portion of the portion of the silicon film 18a that is located above the active region 10a.

A method for fabricating a semiconductor device according to an embodiment of the present disclosure will be described below with reference to FIGS. 7A and 7B, FIGS. 8A and 8B, FIGS. 9A and 9B, FIGS. 10A and 10B, FIGS. 11A and 11B, FIGS. 12A and 12B, and FIGS. 13A and 13B. FIG. 7A to FIG. 13A show cross-sectional views in the gate length direction for sequentially illustrating steps of the method for fabricating the semiconductor device of the embodiment of the present disclosure. FIG. 7B to FIG. 13B show cross-sectional views in the gate width direction for sequentially illustrating steps of the method for fabricating the semiconductor device of the embodiment of the present disclosure.

Figure 7A:
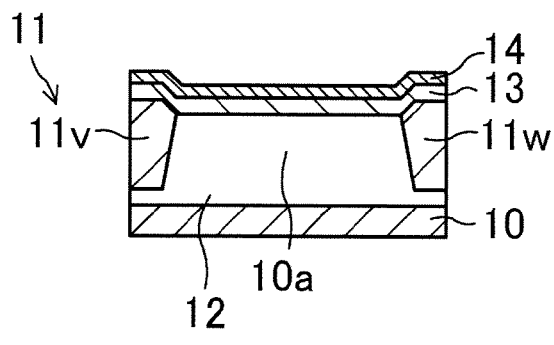
FIGS. 7A and 7B show cross-sectional views for illustrating a method for fabricating a semiconductor device of the embodiment of the present disclosure.
Figure 7B:
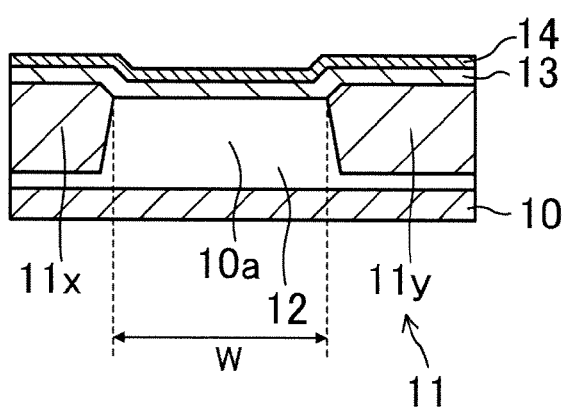

First, as shown in FIGS. 7A and 7B, an isolation region 11 is selectively formed in an upper portion of a semiconductor substrate 10 made, for example, of silicon (Si), by shallow trench isolation (STI), for example. As a result, an active region 10a surrounded by the isolation region 11 is formed in the semiconductor substrate 10. A gate width W (see FIG. 7B) is 200 nm, for example. The gate width W is the width of the active region 10a in the gate width direction. The isolation region 11 which surrounds the active region 10a includes a first isolation portion 11x (see FIG. 7B), a second isolation portion 11y (see FIG. 7B), a third isolation portion 11v (see FIG. 7A), and a fourth isolation portion 11w (see FIG. 7A). Thereafter, a p-type well region 12 is formed in the semiconductor substrate 10.

Next, as shown in FIGS. 7A and 7B, a high-k film 13 is formed on the semiconductor substrate 10. Materials for the high-k film 13 include a metal oxide having a relative dielectric constant of 8 or more, such as a hafnium oxide, e.g., HfSiO, HfSiON, HfO, HfON, HfZrO, and HfZrON, etc. Thereafter, an adjustment metal film 14 containing a metal for adjustment is formed on the high-k film 13. For example, lanthanum (La) is used a as the metal for adjustment.

Figure 8A:
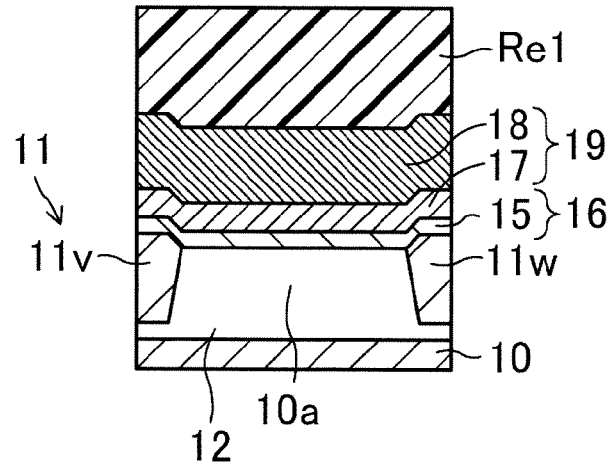
FIGS. 8A and 8B show cross-sectional views for illustrating the method for fabricating the semiconductor device of the embodiment of the present disclosure.
Figure 8B:
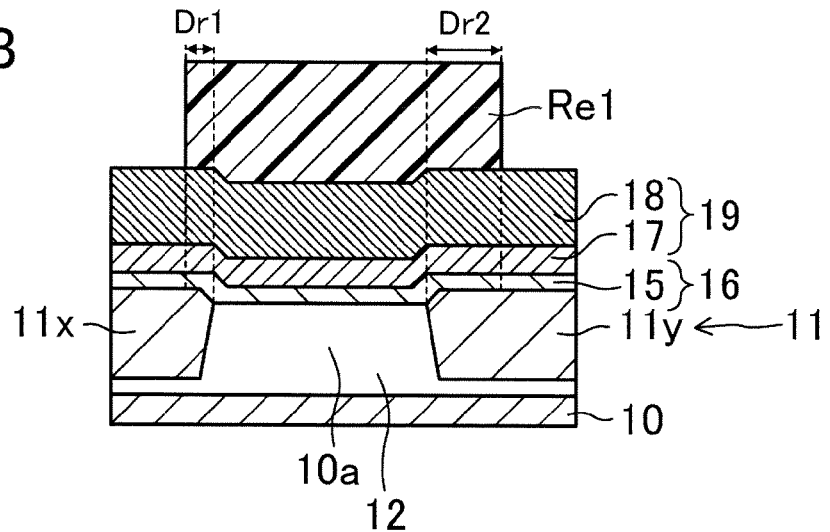

Next, as shown in FIGS. 8A and 8B, the metal for adjustment contained in the adjustment metal film 14 is introduced into the high-k film 13 by a thermal treatment. As a result, dipoles are formed in the high-k film 13. In this manner, a gate insulating film formation film 16 is formed on the semiconductor substrate 10. The gate insulating film formation film 16 includes a high-k film 15 containing the metal for adjustment. After that, the adjustment metal film 14 remaining on the high-k film 15 is selectively removed.

Next, as shown in FIGS. 8A and 8B, a metal film 17 made, for example, of titanium nitride (TiN) or tantalum nitride (TaN) is formed on the gate insulating film formation film 16 by, for example, chemical vapor deposition (CVD). After that, a silicon film 18 made, for example, of polysilicon is formed on the metal film 17 by, for example, CVD. In this manner, a gate electrode formation film 19 including the metal film 17 and the silicon film 18 is formed on the gate insulating film formation film 16.

Next, as shown in FIGS. 8A and 8B, a resist pattern Re1 is formed on the gate electrode formation film 19 by photolithography so as not to cover the both end portions of the gate electrode formation film 19 in the gate width direction. The width of the resist pattern Re1 in the gate width direction is the same as the width of a gate insulating film (see 16a in FIG. 11B described later) and the width of a gate electrode (see 19a in FIG. 11B described later) in the gate width direction.

As shown in FIG. 8B, one end of the resist pattern Re1 in the gate width direction protrudes from one end of the active region 10a in the gate width direction by a protrusion amount Dr1 to be located above the first isolation portion 11x. On the other hand, the other end of the resist pattern Re1 in the gate width direction protrudes from the other end of the active region 10a in the gate width direction by a protrusion amount Dr2 to be located above the second isolation portion 11y.

The protrusion amount Dr1 is, for example, smaller than the protrusion amount Dr2. The protrusion amount Dr1 is in a range of 100 nm to 150 nm, for example. The protrusion amount Dr2 is in a range of 150 nm to 300 nm, for example.

Figure 9A:
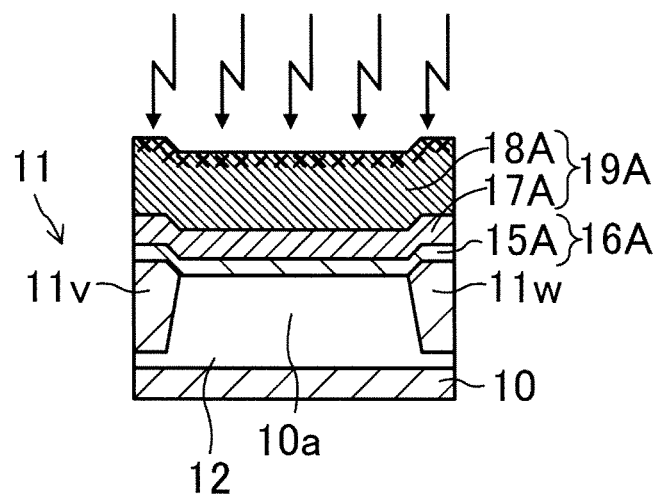
FIGS. 9A and 9B show cross-sectional views for illustrating the method for fabricating the semiconductor device of the embodiment of the present disclosure.
Figure 9B:
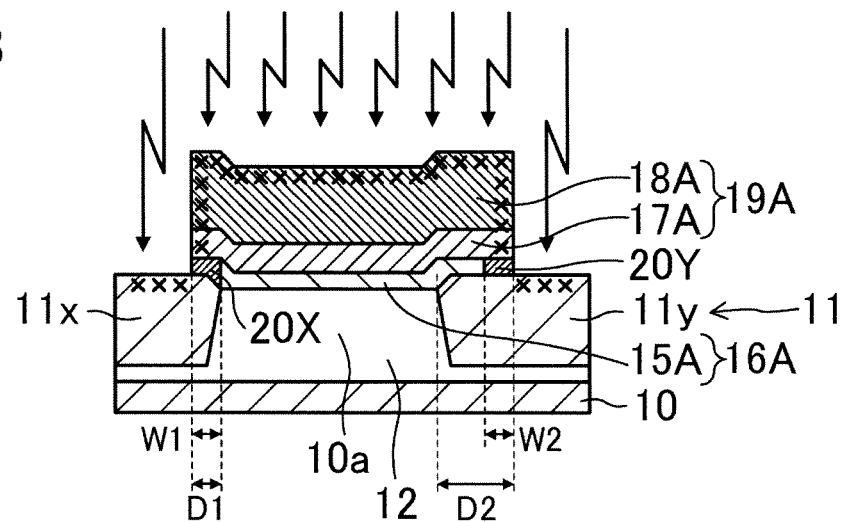

Next, as shown in FIGS. 9A and 9B, the gate electrode formation film 19 including the metal film 17 and the silicon film 18, and the gate insulating film formation film 16 including the high-k film 15 containing the metal for adjustment, are successively patterned by, for example, dry etching using the resist pattern Re1 as a mask. After that, the resist pattern Re1 is removed. In this manner, a gate insulating film formation film 16A, of which the both ends (the both side surfaces) in the gate width direction on the isolation region 11 are exposed, and a gate electrode formation film 19A, of which the both ends (the both side surfaces) in the gate width direction on the isolation region 11 are exposed, are formed. The gate insulating film formation film 16A includes a high-k film 15A containing a metal for adjustment. The gate electrode formation film 19A includes a metal film 17A and a silicon film 18A.

Accordingly, the upper surfaces of the portions of the isolation region 11 that are located laterally outside the gate electrode formation film 19A in the gate width direction are exposed.

One end of the gate insulating film formation film 16A in the gate width direction, and one end of the gate electrode formation film 19A in the gate width direction, protrude from one end of the active region 10a in the gate width direction by a protrusion amount D1 to be located on the first isolation portion 11x. On the other hand, the other end of the gate insulating film formation film 16A in the gate width direction, and the other end of the gate electrode formation film 19A in the gate width direction, protrude from the other end of the active region 10a in the gate width direction by a protrusion amount D2 to be located on the second isolation portion 11y.

The protrusion amount D1 is the same as the protrusion amount Dr1 (see FIG. 8B). The protrusion amount D1 is in a range of 100 nm to 150 nm, for example. The protrusion amount D2 is the same as the protrusion amount Dr2 (see FIG. 8B). The protrusion amount D2 is in a range of 150 nm to 300 nm, for example.

The width of the gate insulating film formation film 16A and the width of the gate electrode formation film 19A in the gate width direction are the same as the width of a gate insulating film (see 16a in FIG. 11B described later) and a gate electrode (see 19a in FIG. 11B described later) in the gate width direction, respectively.

The one end of the gate insulating film formation film 16A in the gate width direction and the one end of the gate electrode formation film 19A in the gate width direction coincide with one end of the gate insulating film in the gate width direction and one end of the gate electrode in the gate width direction. The other end of the gate insulating film formation film 16A in the gate width direction and the other end of the gate electrode formation film 19A in the gate width direction coincide with the other end of the gate insulating film in the gate width direction and the other end of the gate electrode in the gate width direction.

In this manner, the gate electrode formation film 19 and the gate insulating film formation film 16 are successively patterned to define the both ends of each of the gate insulating film and the gate electrode in the gate width direction.

Next, as shown in FIGS. 9A and 9B, the both ends of the gate insulating film formation film 16A in the gate width direction are subjected to a plasma atmosphere containing nitrogen, for example. As a result, the both end portions of the gate insulating film formation film 16A in the gate width direction are nitrided, thereby forming a first nitrided region 20X at one end portion of the gate insulating film formation film 16A in the gate width direction, and a second nitrided region 20Y at the other end portion of the gate insulating film formation film 16A in the gate width direction.

Here, the both ends (i.e., the both side surfaces) of the gate electrode formation film 19A in the gate width direction, the upper surface of the gate electrode formation film 19A, and the upper surfaces of portions of the isolation region 11 (i.e., the first and second isolation portions 11x, 11y) located laterally outside the gate electrode formation film 19A in the gate width direction, are subjected to the plasma atmosphere containing nitrogen. Thus, the nitrogen concentration of the portions of the gate electrode formation film 19A which are subjected to the plasma atmosphere containing nitrogen is higher than the nitride concentration of the other portions of the gate electrode formation film 19A. The nitrogen concentration of the portion of the isolation region 11 which is subjected to the plasma atmosphere containing nitrogen is higher than the nitride concentration of the other portions of the isolation region 11. The cross marks in FIG. 9B are portions of the gate electrode formation film 19A and the isolation region 11 which contain nitrogen.

The nitrogen concentration of a portion of the metal film 17A that is located above the isolation region 11 (i.e., the first and second isolation portions 11x, 11y) is higher than the nitrogen concentration of a portion of the metal film 17A that is located above the active region 10a.

The nitrogen concentration of a portion of the silicon film 18A that is located above the active region 10a is higher in an upper portion thereof than in a lower portion thereof. The nitrogen concentration of a portion of the silicon film 18A that is located above the isolation region 11 (i.e., the first and second isolation portions 11x, 11y) is higher than the nitrogen concentration of the lower portion of the portion of the silicon film 18A that is located above the active region 10a.

The nitrogen concentrations of portions of the isolation region 11 located laterally outside the gate electrode formation film 19A in the gate width direction are higher than the nitrogen concentration of a portion of the isolation region 11 located below the gate electrode formation film 19A. The nitrogen concentrations of the portions of the isolation region 11 located laterally outside the gate electrode formation film 19A in the gate width direction are higher than the nitrogen concentrations of the portions of the isolation region 11 located laterally outside the active region 10a in the gate length direction (i.e., the third and fourth isolation portions 11v, 11w).

The concentration of nitrogen contained in the first nitrided region 20X is N1. The concentration of nitrogen contained in the second nitrided region 20Y is N2. The concentration of nitrogen contained in a portion of the gate insulating film formation film 16A located on the active region 10a is N. Here, a relationship of N1>N and N2>N is satisfied.

The first nitrided region 20X and the second nitrided region 20Y are formed in the same step. Thus, the nitrogen concentration N1 and the nitrogen concentration N2 are substantially the same (N1=N2).

The nitrogen concentration N1, N2 is, for example, equal to or higher than $2 \times 10^{22}$ atoms/cm$^3$ (N1$\geq 2 \times 10^{22}$ atoms/cm$^3$, N2$\geq 2 \times 10^{22}$ atoms/cm$^3$).

The nitrogen concentration N is, for example, equal to or lower than $1 \times 10^{22}$ atoms/cm$^3$ (N$\leq 1 \times 10^{22}$ atoms/cm$^3$). Specifically, as a first example, if a high dielectric constant material not including nitrogen (e.g., HfSiO, HfO, HfZrO, etc.) is used as a material for the high-k film 13 (a high-k film to which a metal for adjustment has not been introduced yet), the nitrogen concentration N is 0 atoms/cm$^3$. As a second example, if a high dielectric constant material containing nitrogen (e.g., HfSiON, HfON, HfZrON, etc.) is used as a material for the high-k film 13, the nitrogen concentration N is substantially the same as the concentration of nitrogen contained in the high-k film 13.

The width of the first nitrided region 20X in the gate width direction is W1, and the width of the second nitrided region 20Y in the gate width direction is W2. Here, a relationship of W1$\leq$D1 and W2$\leq$D2 is satisfied.

The first nitrided region 20X and the second nitrided region 20Y are formed in the same step. Thus, the width W1 and the width W2 are substantially the same (W1=W2).

The width W1, W2 is in a range of 50 nm to 100 nm, for example.

The width W1 is set to equal to or smaller than the protrusion amount D1 (W1$\leq$D1), and the first nitrided region 20X is formed only on the isolation region 11 (i.e., the first isolation portion 11x), and is not formed on the active region 10a. Similarly, the width W2 is set to equal to or smaller than the protrusion amount D2 (W2$\leq$D2), and the second nitrided region 20Y is formed only on the isolation region 11 (it the second isolation portion 11y), and is not formed on the active region 10a. The reason why the first and second nitrided regions 20x, 20y are not formed on the active region 10a is as follows.

In general, in a MIS transistor which includes a gate insulating film including a high-k film, a portion of the high-k film that is located on an active region has a significant effect on the effective work function of the MIS transistor, whereas a portion of the high-k film that is located on the isolation region does not have a significant effect on the effective work function of the MIS transistor.

In general, in a MIS transistor which includes a gate insulating film including a high-k film, the number of dipoles generated in the high-k film increases with an increase in the concentration of nitrogen contained in the high-k film. As a result, the effective work function of the MIS transistor is reduced.

Accordingly, if a nitrided region is formed on the active region, the following problem may arise. That is, in this case, the concentration of nitrogen contained in a portion of the high-k film that is located on the active region (in other words, a portion which has a significant effect on the effective work function of the MIS transistor) is not constant, and the portion includes a portion including a nitrided region (that is, a high concentration portion having a relatively high nitrogen concentration) and a portion not including a nitrided region (that is, a low concentration portion having a relatively low nitrogen concentration). Thus, in the MIS transistor, the high concentration portion has a smaller effective work function than the effective work function of the low concentration portion. Accordingly, the effective work function of the MIS transistor is not constant, which leads to unstable transistor characteristics of the MIS transistor.

In view of this, in the present embodiment, the widths W1, W2 are determined to satisfy the following relationship, W1$\leq$D1 and W2$\leq$D2, so as not to form the first nitrided region 20X and the second nitrided region 20Y on the active region 10a. Accordingly, the concentration of nitrogen contained in the portion of the high-k film 15A that is located on the active region 10a can be constant. Thus, the MIS transistor which includes a gate insulating film (see 16a in FIGS. 11A and 11B described later) including a high-k film (see 15a in FIGS. 11A and 11B described later) obtained by patterning the high-k film 15A, has a constant effective work function, which leads to stable transistor characteristics of the MIS transistor.

Figure 10A:
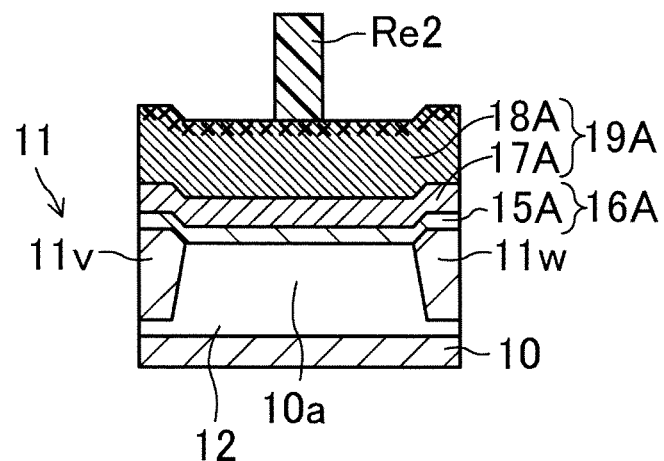
FIGS. 10A and 10B show cross-sectional views for illustrating the method for fabricating the semiconductor device of the embodiment of the present disclosure.
Figure 10B:
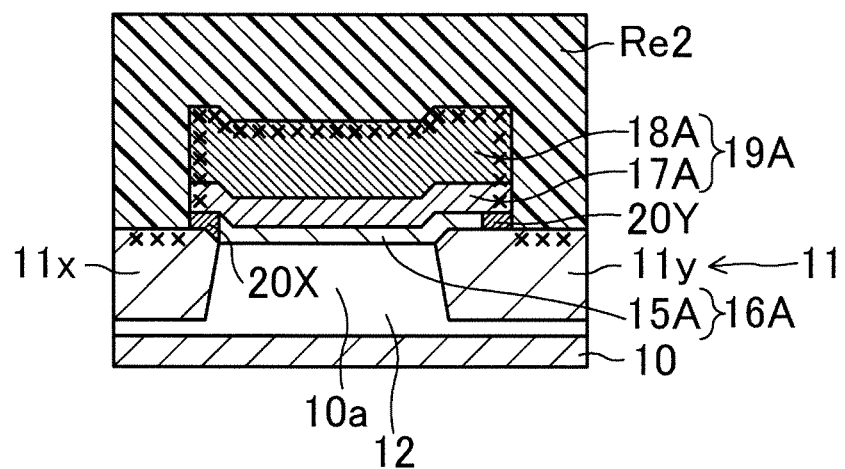

Next, as shown in FIGS. 10A and 10B, a resist pattern Re2 is formed on the gate electrode formation film 19A and the isolation region 11 (i.e., the first and second isolation portions 11x, 11y) by photolithography so as not to cover the both end portions of the gate electrode formation film 19A in the gate length direction. The width of the resist pattern Re2 in the gate length direction is the same as the width of a gate insulating film (see 16a in FIG. 11A described later) and the width of a gate electrode (see 19a in FIG. 11A described later) in the gate length direction.

Figure 11A:
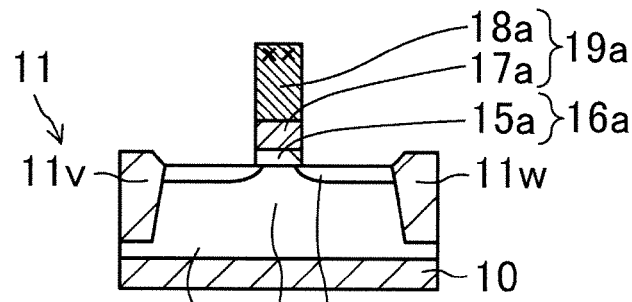
FIGS. 11A and 11B show cross-sectional views for illustrating the method for fabricating the semiconductor device of the embodiment of the present disclosure.
Figure 11B:
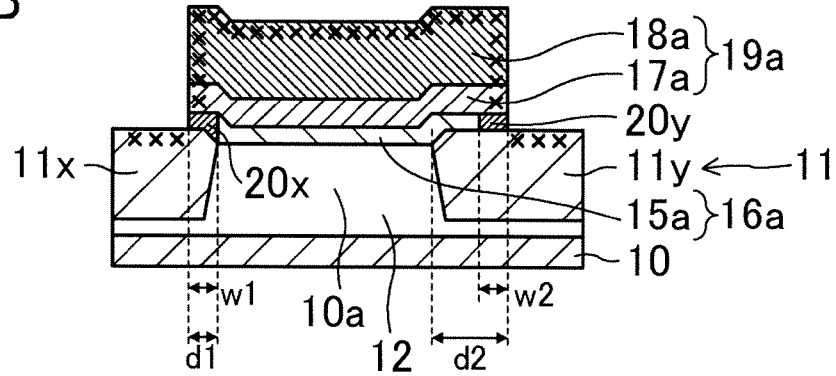

Next, as shown in FIGS. 11A and 11B, the gate electrode formation film 19A including a metal film 17a and a silicon film 18a, and the gate insulating film formation film 16A including a high-k film 15A containing a metal for adjustment are successively patterned by, for example, dry etching using the resist pattern Re2 as a mask. After that, the resist pattern Re2 is removed. In this manner, a gate insulating film 16a including a high-k film 15a containing a metal for adjustment, and a gate electrode 19a including a metal film 17a and a silicon film 18a are successively formed on the active region 10 and the isolation region 11 (i.e., the first and second isolation portions 11x, 11y). The gate insulating film 16a includes first and second nitrided regions 20x, 20y at portions located on the isolation region 11 (i.e., the first and second isolation portions 11x, 11y).

One end of each of the gate insulating film 16a and the gate electrode 19a in the gate width direction protrudes from one end of the active region 10a in the gate width direction by a protrusion amount d1 to be located on the first isolation portion 11x. On the other hand, the other end of each of the gate insulating film 16a and the gate electrode 19a in the gate width direction protrudes from the other end of the active region 10a in the gate width direction by a protrusion amount d2 to be located on the second isolation portion 11y.

The protrusion amount d1 is the same as the protrusion amount Dr1, D1 (see FIG. 8B and FIG. 9B described above). The protrusion amount d1 is in a range of 100 nm to 150 nm, for example. The protrusion amount d2 is the same as the protrusion amount Dr2, D2 (see FIG. 8B and FIG. 9B described above). The protrusion amount d2 is in a range of 150 nm to 300 nm, for example.

A concentration of nitrogen contained in the first nitrided region 20x is n1. A concentration of nitrogen contained in the second nitrided region 20y is n2. A concentration of nitrogen contained in a portion of the gate insulating film 16a that is located on the active region 10a is n. Here, a relationship of n1>n and n2>n is satisfied.

As mentioned above, the nitrogen concentration N1 of the first nitrided region 20X is substantially the same as the nitrogen concentration N2 of the second nitrided region 20Y (N1=N2). Thus, the nitrogen concentration n1 of the first nitrided region 20x obtained by patterning the first nitrided region 20X is substantially the same as the nitrogen concentration n2 of the second nitrided region 20y obtained by patterning the second nitrided region 20Y (n1=n2).

The nitrogen concentration n1, n2 is equal to or higher than, for example, $2\times10^{22}$ atoms/cm$^3$ (n1≥$2\times10^{22}$ atoms/cm$^3$, n2≥$2\times10^{22}$ atoms/cm$^3$). The nitrogen concentration n is equal to or lower than, for example, $1\times10^{22}$ atoms/cm$^3$ (n≤$1\times10^{22}$ atoms/cm$^3$).

The width of the first nitrided region 20x in the gate width direction is w1, and the width of second nitrided region 20y in the gate width direction is w2. Here, a relationship of w1≤d1 and w2≤d2 is satisfied. In the present embodiment, for example, w1 is equal to d1, and w2 is smaller than d2.

As mentioned above, the width W1 of the first nitrided region 20X is substantially the same as the width W2 of the second nitrided region 20Y (W1=W2). Thus, the width w1 of the first nitrided region 20x obtained by patterning the first nitrided region 20X is substantially the same as the width w2 of the second nitrided region 20y obtained by patterning the second nitrided region 20Y (w1=w2).

The width w1 is equal to the width W1 (see FIG. 9B), and the width w1 is in a range of 50 nm to 100 nm, for example. The width w2 is equal to the width W2 (see FIG. 9B), and the width w2 is in a range of 50 nm to 100 nm, for example.

The nitrogen concentrations of portions of the isolation region 11 located laterally outside the gate electrode 19a in the gate width direction are higher than the nitrogen concentration of a portion of the isolation region 11 located below the gate electrode 19a. The nitrogen concentrations of the portions of the isolation region 11 located laterally outside the gate electrode 19a in the gate width direction are higher than the nitrogen concentrations of portions of the isolation region 11 located laterally outside the active region 10a in the gate length direction (the third and fourth isolation portions 11v, 11w).

The nitrogen concentration of a portion of the metal film 17a located above the isolation region 11 (i.e., the first and second isolation portions 11x, 11y) is higher than the nitrogen concentration of a portion of the metal film 17a located above the active region 10a.

The nitrogen concentration of a portion of the silicon film 18a located above the active region 10a is higher in an upper portion thereof than in a lower portion thereof. The nitrogen concentration of a portion of the silicon film 18a located above the isolation region 11 (i.e., the first and second isolation portions 11x, 11y) is higher than the nitrogen concentration of the lower portion of the portion of the silicon film 18a located above the active region 10a.

In general, nitrogen contained in an isolation region does not easily migrate in the isolation region due to a thermal treatment. Similarly, in general, nitrogen contained in a metal film does not easily migrate in the metal film due to a thermal treatment. In contrast, in general, nitrogen in a silicon film easily migrates in the silicon film due to a thermal treatment. Thus, the nitrogen contained in the silicon film 18a migrates in the silicon film 18a due to a thermal treatment performed after formation of the silicon film 18a (e.g., a thermal treatment performed to activate an n-type impurity contained in the n-type source/drain implantation region). This may vary the relationship between the high and low nitrogen concentrations in the silicon film 18a.

As described, the gate electrode formation film 19A and the gate insulating film formation film 16A are successively patterned to define the both ends of each of the gate insulating film 16a and the gate electrode 19a in the gate length direction.

In the present embodiment, as shown in FIGS. 9A and 9B, the gate electrode formation film 19 and the gate insulating film formation film 16 are successively patterned (i.e., the both end portions of each of the gate electrode formation film 19 and the gate insulating film formation film 16 in the gate width direction are successively removed) to form the gate insulating film formation film 16A of which the both ends in the gate width direction are exposed, and the gate electrode formation film 19A of which the both ends in the gate width direction are exposed. Thereafter, the both end portions of the gate insulating film formation film 16A in the gate width direction are nitrided to form the first and second nitrided regions 20X, 20Y. After that, as shown in FIGS. 11A and 11B, the gate electrode formation film 19A and the gate insulating film formation film 16A are successively patterned (i.e., the both end portions of each of the gate electrode formation film 19A and the gate insulating film formation film 16A in the gate length direction are successively removed) to form the gate insulating film 16a and the gate electrode 19a.

In the present embodiment, the both end portions of the gate insulating film formation film 16A in the gate width direction are nitrided. Thereafter, the both end portions of each of the gate electrode formation film 19A and the gate insulating film formation film 16A in the gate length direction are successively removed to form the gate insulating film 16a and the gate electrode 19a. Accordingly, it is possible to prevent the both ends (both side surfaces) of each of the gate insulating film 16a and the gate electrode 19a in the gate length direction from being nitrided.

Figure 14:
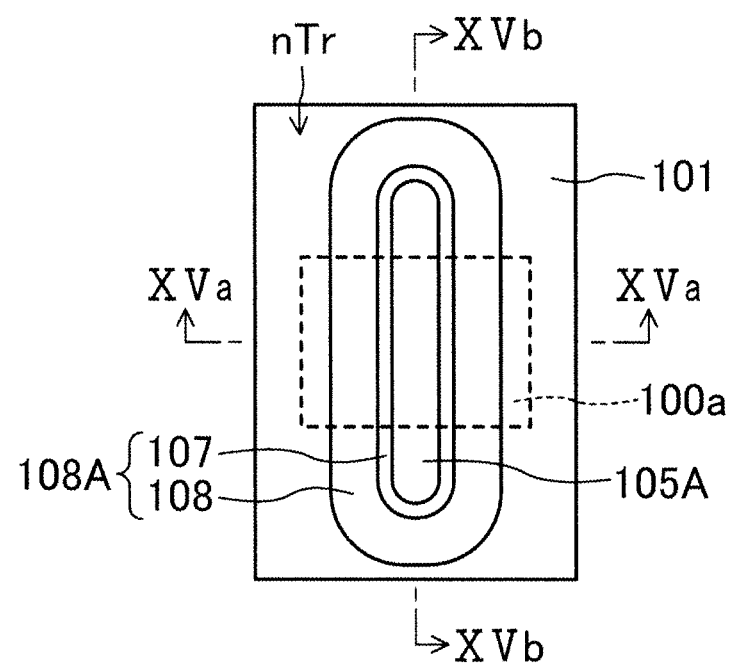
FIG. 14 is a plan view showing a configuration of a conventional semiconductor device.
Figure 15A:
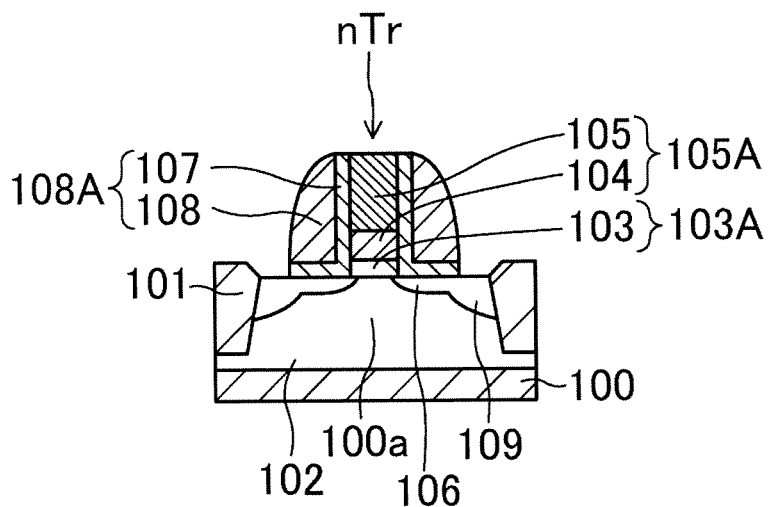
FIGS. 15A and 15B show cross-sectional views of the configuration of the conventional semiconductor device.
Figure 15B:
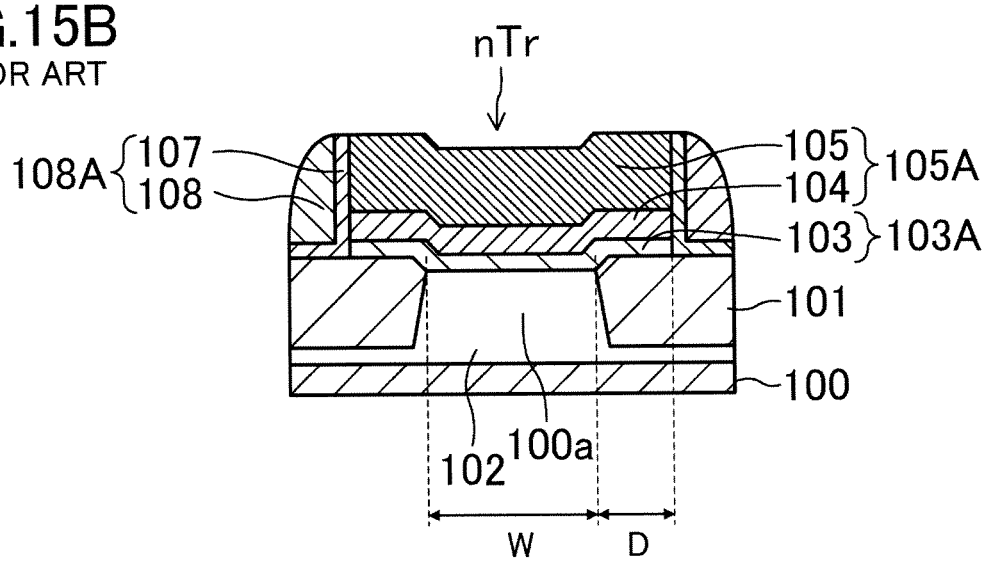
Figure 16:
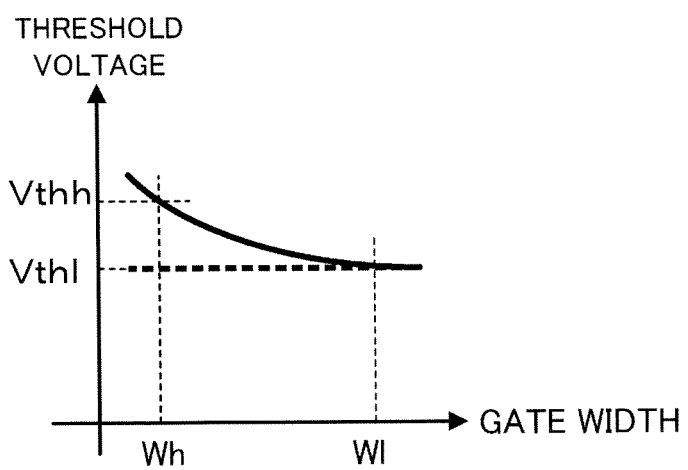
FIG. 16 is a graph showing a relationship between the gate width and a threshold voltage.

In the present embodiment, a patterning process is performed twice to form the gate insulating film 16a and the gate electrode 19a. Thus, the gate insulating film 16a and the gate electrode 19a have a rectangular shape when viewed from above (see FIG. 5). In contrast, in conventional cases, a pattern process is performed once to form the gate insulating film and the gate electrode. Thus, corner portions of the gate insulating film and the gate electrode have a round shape when viewed from above (see FIG. 14 described above).

Next, as shown in FIGS. 11A and 11B, n-type extension implantation regions 21 are formed in portions of the active region 10a laterally outside the gate electrode 19a.

Figure 12A:
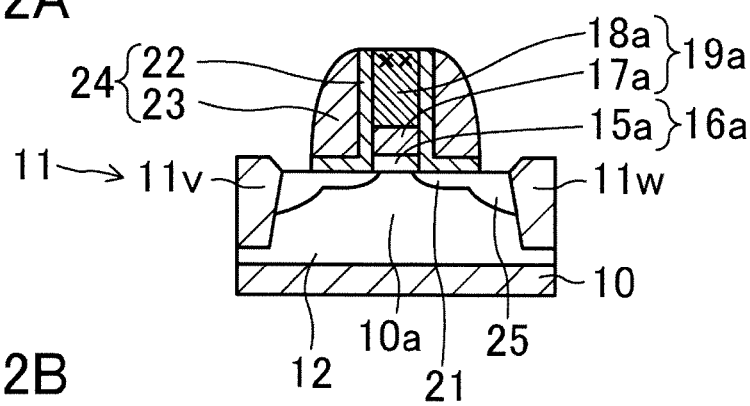
FIGS. 12A and 12B show cross-sectional views for illustrating the method for fabricating the semiconductor device of the embodiment of the present disclosure.
Figure 12B:
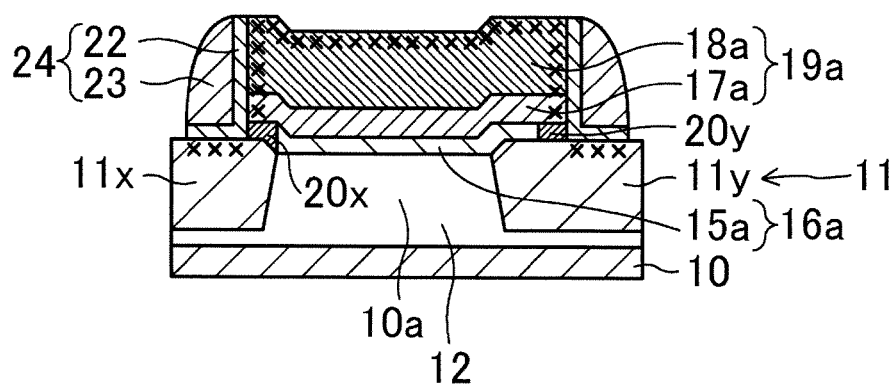

Next, as shown in FIGS. 12A and 12B, an inner sidewall formation film made, for example, of silicon oxide ($SiO_2$) and an outer sidewall formation film made, for example, of silicon nitride (SiN) are successively formed on the entire surface of the semiconductor substrate 10 by, for example, CVD. After that, anisotropic dry etching, for example, is successively performed on the outer sidewall formation film and the inner sidewall formation film. As a result, a sidewall 24 including an inner sidewall 22 having an L-shaped cross section and an outer sidewall 23 is formed on the side surface of the gate electrode 19a.

Next, as shown in FIGS. 12A and 12B, n-type source/drain implantation regions 25 are formed in portions of the active region 10a located laterally outside the sidewall 24.

Figure 13A:
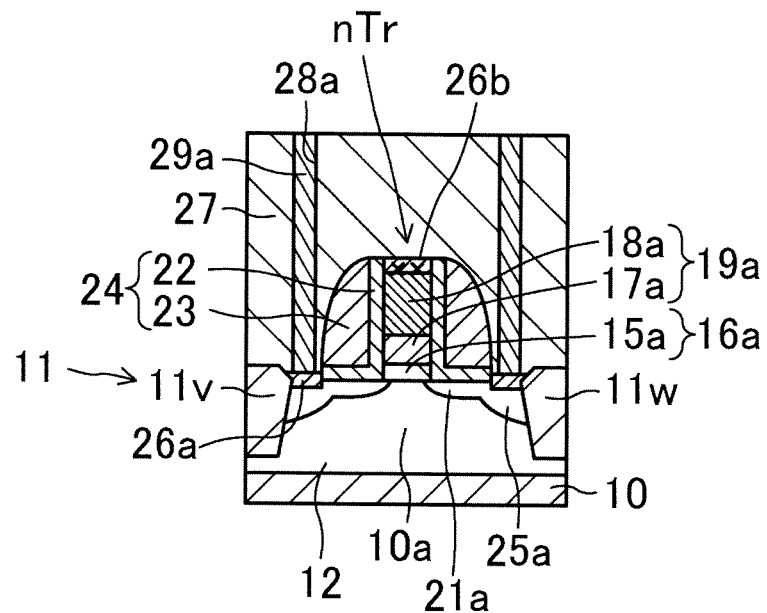
FIGS. 13A and 13B show cross-sectional views for illustrating the method for fabricating the semiconductor device of the embodiment of the present disclosure.
Figure 13B:
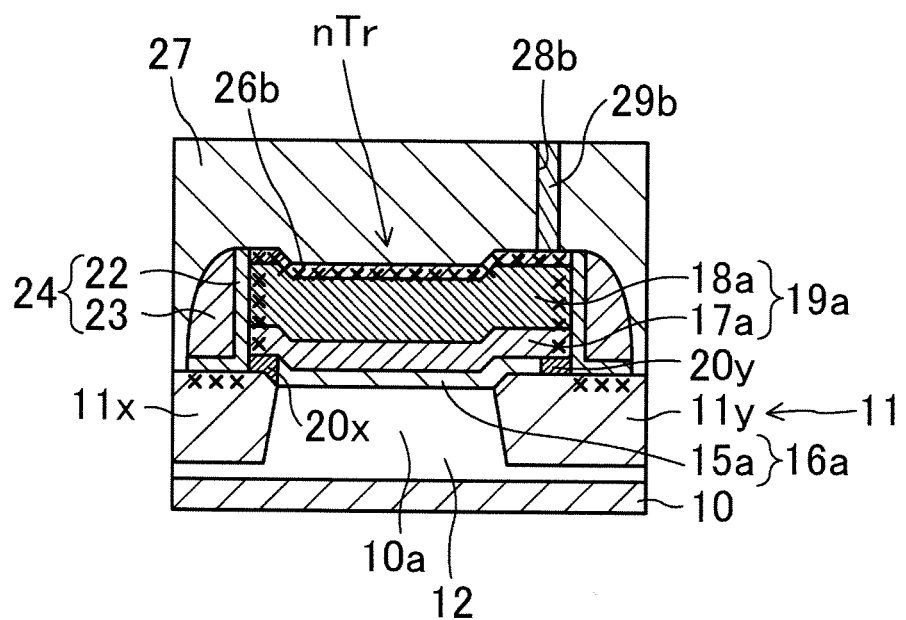

Next, as shown in FIGS. 13A and 13B, a thermal treatment is performed at, for example, 900° C. As a result, the n-type impurity contained in the n-type extension implantation region 21 is activated, thereby forming an n-type extension region 21a. Also, the n-type impurity contained in the n-type source/drain implantation region 25 is activated, thereby forming the n-type source/drain region 25a.

In this case, the gate insulating film 16a includes first and second nitrided regions 20x, 20y at portions located on the isolation region 11 (i.e., the first and second isolation portions 11x, 11y). The first and second nitrided regions 20x, 20y can prevent oxygen (O) from being diffused in the regions 20x, 20y themselves. As a result, it is possible to prevent the oxygen contained in the isolation region 11 from being diffused into the high-k film 15a (in particular, into a portion of the high-k film 15a located on the active region 10a) through the first and second nitrided regions 20x, 20y.

Next, as shown in FIGS. 13A and 13B, a first silicide film 26a is formed on the n-type source/drain region 25a. Also, a second silicide film 26b is formed on the silicon film 18a. After that, an interlayer insulating film 27 is formed on the entire surface of the semiconductor substrate 10. Then, a first contact hole 28a through which part of the surface of the first silicide film 26a is exposed, and a second contact hole 28b through which part of the surface of the second silicide film 26b is exposed, are formed in the interlayer insulating film 27. After that, the first contact hole 28a and the second contact hole 28b are filled with a metal film made, for example, of tungsten (W), thereby forming a first contact plug 29a and a second contact plug 29b.

In this manner, it is possible to fabricate a semiconductor device according to the present embodiment.

In the present embodiment, the first nitrided region 20x is formed in a portion of the gate insulating film 16a that is located on the first isolation portion 11x, and the nitrogen concentration n1 of the first nitrided region 20x is made higher than the nitrogen concentration n of a portion of the gate insulating film 16a that is located on the active region 10a. That is, a relationship of n1>n is satisfied. As a result, it is possible to prevent the oxygen (O) contained in the isolation region 11 from being diffused into the first nitrided region 20x during a thermal treatment. Thus, it is possible to prevent the oxygen contained in the isolation region 11 from being diffused into the high-k film 15a (in particular, a portion of the high-k film 15a that is located on the active region 10a) through the first nitrided region 20x.

In particular, the first nitrided region 20x is formed in the entire part of the portion of the gate insulating film 16a that is located on the first isolation portion 11x. In other words, the width w1 of the first nitrided region 20x in the gate width direction is equal to the protrusion amount d1 (w1=d1). As a result, the area of the gate insulating film 16a other than the first and second nitrided regions 20x, 20y can be prevented from contacting the first isolation portion 11x.

Also, the second nitrided region 20y is formed in a portion of the gate insulating film 16a that is located on the second isolation portion 11y, and the nitrogen concentration n2 of the second nitrided region 20y is made higher than the nitrogen concentration n. That is, a relationship of n2>n is satisfied. As a result, it is possible to prevent the oxygen contained in the isolation region 11 from being diffused into the second nitrided region 20y during a thermal treatment. Thus, it is possible to prevent the oxygen contained in the isolation region 11 from being diffused into the high-k film 15a (in particular, a portion of the high-k film 15a that is located on the active region 10a) through the second nitrided region 20y.

As described, the second nitrided region 20y is formed in part of the portion of the gate insulating film 16a that is located on the second isolation portion 11y. Thus, even if the protrusion amount d2 is relatively large, it is possible to reduce the area of the gate insulating film 16a, other than the first and second nitrided regions 20x, 20y, which contacts the second isolation portion 11y.

As described, it is possible to prevent the oxygen contained in the isolation region 11 from being diffused into the high-k film 15a (in particular, a portion of the high-k film 15a that is located on the active region 10a) through the first and second nitrided regions 20x, 20y. Accordingly, it is possible to prevent reaction between a metal for adjustment (e.g., La) contained in the high-k film 15a and oxygen contained in the isolation region 11, and prevent generation of neutralized dipoles. Thus, even if the gate width is reduced with miniaturization of a semiconductor device, an increase in the threshold voltage of the n-type MIS transistor nTr can be prevented.

In addition, as shown in FIG. 9B, both end portions of the gate insulating film formation film 16 in the gate width direction are removed to expose the both ends of the gate insulating film formation film 16A in the gate width direction, and thereafter, the end portions of the gate insulating film formation film 16A in the gate width direction are nitrided to form the first and second nitrided regions 20X, 20Y. That is, the both end portions of the gate insulating film formation film 16 in the gate width direction are removed to form the first and second nitrided regions 20X, 20Y. The protrusion amounts D1, D2 can be reduced at this time, which leads to a reduction in the protrusion amounts d1, d2. Thus, a portion of the gate insulating film 16a which contacts the isolation region 11 (i.e., the first and second isolation portions 11x, 11y) can be reduced. Accordingly, it is possible to reduce the amount of oxygen which is diffused into the high-k film 15a (i.e., particular, a portion of the high-k film 15a which contacts the active region 10a) from the isolation region 11 through the portion of the gate insulating film 16a which contacts the isolation region 11. Thus, it is possible to further prevent reaction between a metal for adjustment (e.g., La) contained in the high-k film 15a and oxygen contained in the isolation region 11, and prevent generation of neutralized dipoles.

Further, a relationship of w1≤d1 and w2≤d2 is satisfied. Accordingly, the nitrogen concentration n of a portion of the gate insulating film 16a located on the active region 10a can be constant. Thus, the effective work function of the n-type MIS transistor nTr can be constant, which leads to stable transistor characteristics of the n-type MIS transistor nTr.

In the present embodiment, an example was described in which, as shown, for example, in FIG. 9B, both ends of the gate insulating film formation film 16A in the gate width direction are subjected to plasma atmosphere containing nitrogen to form the first and second nitrided regions 20X, 20Y. However, the present disclosure is not limited to this configuration.

For example, the first and second nitrided regions may be formed by implanting ions containing nitrogen into a gate insulating film formation film under conditions in which implantation energy is 20 keV, an implantation dose amount is $5 \times 10^{14}$ ions/cm$^2$, and an implantation angle is 15°. The implantation angle is an angle with respect to the normal orthogonal to the main surface of the semiconductor substrate 10. Here, the ions including nitrogen are implanted in both ends (both side surfaces) and a top surface of the gate electrode formation film, and top surfaces of portions of the isolation region located laterally outside the gate electrode formation film.

In the present embodiment, an example was described in which as shown in FIG. 11B, the first nitrided region 20x is formed in the entire part of the portion of the gate insulating film 16a that is located on the first isolation portion 11x, that is, w1=d1. However, the present disclosure is not limited to this configuration. For example, w1 may be smaller than d1. In other words, it is only necessary to satisfy the relationship of w1≤d1. In particular, it is preferable that w1 is equal to d1. If w1 is equal to d1, the area of the gate insulating film 16a other than the first and second nitrided regions 20x, 20y can be prevented from contacting the first isolation portion 11x, as described above.

In the present embodiment, an example was described in which as shown in FIG. 11B, the second nitrided region 20y is formed in part of the portion of the gate insulating film 16a that is located on the second isolation portion 11y, that is, w2<d2. However, the present disclosure is not limited to this configuration. For example, w2 may be equal to d2. In other words, it is only necessary to satisfy the relationship of w2≤d2. In particular, it is preferable that w2 is equal to d2. If w2 is equal to d2, the area of the gate insulating film other than the first and second nitrided regions can be prevented from contacting the second isolation portion.

In the present embodiment, an example was described in which among portions of the gate insulating film 16a that are located on the isolation region 11, the first active region 20x is formed in the entire part of the portion of the gate insulating film 16a that is located on the first isolation portion 11x, whereas the second nitrided region 20y is formed in part of the portion of the gate insulating film 16a that is located on the second isolation portion 11y. However, the present disclosure is not limited to this configuration. For example, a nitrided region may be formed in at least part of the portion of the gate insulating film that is located on the isolation region.

In the present embodiment, an example was described in which as shown in FIG. 11B, the width w1 of the first nitrided region 20x in the gate width direction, and the width w2 of the second nitrided region 20y in the gate width direction are substantially the same (w1=w2). However, the present disclosure is not limited to this configuration. For example, the width of the first nitrided region in the gate width direction and the width of the second nitrided region in the gate width direction may be different from each other. However, as mentioned above, it is preferable to form the first and second nitrided regions only on the isolation region (i.e., the first and second isolation portions).

In the present embodiment, an example was described in which as shown in FIG. 11B, the nitrogen concentration n1 of the first nitrided region 20x and the nitrogen concentration n2 of the second nitrided region 20y are substantially the same (n1=n2). However, the present disclosure is not limited to this configuration. For example, the nitrogen concentration of the first nitrided region and the nitrogen concentration of the second nitrided region may be different from each other.

In the present embodiment, an example was described in which the first and second nitrided regions 20x, 20y containing nitrogen are formed in the portions of the gate insulating film 16a that are located on the isolation region 11. However, the present disclosure is not limited to this configuration. In other words, any regions which can prevent oxygen from being diffused into the regions themselves during a thermal treatment may be formed in the portions of the gate insulating film that are located on the isolation region.

In the present embodiment, an example was described in which, for example, La is used as a metal for adjustment. However, the present disclosure is not limited to this configuration. Instead of La, another lanthanoid element or magnesium (Mg), etc., may be used.

In the present embodiment, an example was described in which the protrusion amount d1 is smaller than the protrusion amount d2 (d1<d2). However, the present disclosure is not limited to this configuration. As a first example, the protrusion amount d1 may be equal to the protrusion amount d2 (d1=d2). As a second example, the protrusion amount d1 may be larger than the protrusion amount d2 (d1>d2).

In the present embodiment, a gate insulating film 16a including a high-k film 15a containing a metal for adjustment is used as an example. However, the present disclosure is not limited to this configuration. For example, a gate insulating film which includes a underlying film formed on an active region and a high-k film formed on the underlying film and containing a metal for adjustment may be used. Materials for the underlying film include, for example, a silicon oxide, etc.

In the present embodiment, as shown in FIG. 6B, the high-k film 15a containing a metal for adjustment is in contact with the isolation region 11. However, in the case of the gate insulating film which includes a underlying film made of a silicon oxide and a high-k film containing a metal for adjustment, the underlying film is formed on the active region, but not formed on the isolation region if, for example, the underlying film made of a silicon oxide is formed by thermal oxidation. Thus, the oxygen contained in the isolation region is diffused into the high-k film containing a metal for adjustment, because the high-k film containing the metal for adjustment is formed in contact with the isolation region. Accordingly, by forming a nitrided region in at least part of a portion of the gate insulating film that is located on the isolation region, similar effects as the effects of the present embodiment can be obtained also in the case of the gate insulating film which includes a underlying film made of a silicon oxide and a high-k film containing a metal for adjustment.

In the present embodiment, a semiconductor device including an n-type MIS transistor nTr was described as an example, but the present disclosure is not limited to this configuration. For example, a semiconductor device including an n-type MIS transistor and a p-type MIS transistor may also be used.

As described above, in the present disclosure, it is possible to prevent an increase in the threshold voltage of a MIS transistor. Thus, the present disclosure is useful as a semiconductor device including a MIS transistor which includes a gate insulating film including a high-k film containing a metal for adjustment, and a method for fabricating the semiconductor device.

What is claimed is:

1. A semiconductor device, comprising:
a MIS transistor, wherein the MIS transistor includes:
an active region surrounded by an isolation region in a semiconductor substrate,
a gate insulating film formed on the active region and the isolation region, and having a high dielectric constant film, and
a gate electrode formed on the gate insulating film,
a nitrided region is formed in at least part of a portion of the gate insulating film that is located on the isolation region,
a concentration of nitrogen contained in the nitrided region is nx, and a concentration of nitrogen contained in a portion of the gate insulating film that is located on the active region is n, wherein a relationship of $$nx > n$$

is satisfied, and the nitrided region is not formed in the portion of the gate insulating film that is located on the active region.

2. The semiconductor device of claim 1, wherein
the nitrided region includes a first nitrided region formed at one end of the gate insulating film in a gate width direction, and a second nitrided region formed at the other end of the gate insulating film in the gate width direction, a width of the first nitrided region in the gate width direction is w1, a width of the second nitrided region in the gate width direction is w2, a protrusion amount from one end of the active region in the gate width direction to one end of the gate insulating film in the gate width direction is d1, and a protrusion amount from the other end of the active region in the gate width direction to the other end of the gate insulating film in the gate width direction is d2, wherein a relationship of $$w1 \leq d1 \text{ and } w2 \leq d2$$

is satisfied.

3. The semiconductor device of claim 1, wherein nitrogen concentrations of portions of the isolation region that are located laterally outside the gate electrode in the gate width direction are higher than a nitrogen concentration of a portion of the isolation region that is located below the gate electrode.

4. The semiconductor device of claim 1, wherein nitrogen concentrations of portions of the isolation region that are located laterally outside the gate electrode in the gate width direction are higher than nitrogen concentrations of portions of the isolation region that are located laterally outside the active region in a gate length direction.

5. The semiconductor device of claim 1, wherein the nitrogen concentration nx is $2 \times 10^{22}$ atoms/cm$^3$ or higher.

6. The semiconductor device of claim 1, wherein the nitrogen concentration n is $1 \times 10^{22}$ atoms/cm$^3$ or lower.

7. The semiconductor device of claim 1, wherein the MIS transistor is an n-type MIS transistor.

8. The semiconductor device of claim 1, wherein the gate insulating film contains a metal for adjustment.

9. The semiconductor device of claim 8, wherein the metal for adjustment is lanthanum.

10. The semiconductor device of claim 1, wherein the gate electrode includes a metal film formed on the gate insulating film, and a silicon film formed on the metal film.

11. The semiconductor device of claim 10, wherein a nitrogen concentration of a portion of the metal film that is located above the isolation region is higher than a nitrogen concentration of a portion of the metal film that is located above the active region.

* * * * *